United States Patent
Yi et al.

(10) Patent No.: US 11,012,888 B2
(45) Date of Patent: May 18, 2021

(54) METHOD AND APPARATUS FOR PERFORMING DUAL HEADER COMPRESSION SCHEMES IN WIRELESS COMMUNICATION SYSTEM

(71) Applicant: LG ELECTRONICS INC., Seoul (KR)

(72) Inventors: Seungjune Yi, Seoul (KR); Geumsan Jo, Seoul (KR); Sunyoung Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/844,494

(22) Filed: Apr. 9, 2020

(65) Prior Publication Data

US 2020/0236591 A1   Jul. 23, 2020

Related U.S. Application Data

(63) Continuation of application No. PCT/KR2019/016908, filed on Dec. 3, 2019.

(51) Int. Cl.
*H04W 28/06*   (2009.01)

(52) U.S. Cl.
CPC .................. *H04W 28/06* (2013.01)

(58) Field of Classification Search
CPC ......... H04L 69/04; H04L 69/16; H04L 69/22; H04L 65/607; H04L 65/608; H04L 69/324; H04L 29/06; H04L 69/161; H04L 65/80; H04L 69/24; H04L 2212/00; H04L 29/06027; H04L 45/74; H04L 65/4076; H04L 69/14; H04L 12/1877; H04L 12/4633; H04L 63/0428; H04L 67/04; H04L 69/32; H04L 12/189; H04L 1/0003; H04L 1/0009; H04L 1/0045; H04L 1/007; H04L 1/0072; H04L 47/14; H04L 47/15; H04L 47/38; H04L 47/70; H04L 47/824; H04L 49/3009; H04L 63/164; H04L 12/14; H04L 12/1403; H04L 12/1863; H04L 12/1886; H04L 1/0006; H04L 1/0042; H04L 1/06; H04L 1/16; H04L 1/1877; H04L 2001/0093; H04L 29/08; H04L 41/0803; H04L 43/50; H04L 45/38;
(Continued)

(56) References Cited

U.S. PATENT DOCUMENTS

| 7,031,666 B2 * | 4/2006 | Hsu ..................... H04L 12/1877 455/72 |
| 8,717,203 B2 * | 5/2014 | Fallon ....................... G06T 9/00 341/51 |

(Continued)

OTHER PUBLICATIONS

CATT, "Ethernet Header Compression", 3GPP TSG RAN WG2 Meeting #104, Nov. 12-16, 2018, R2-1816362.
(Continued)

*Primary Examiner* — Kashif Siddiqui
(74) *Attorney, Agent, or Firm* — Dentons US LLP

(57) ABSTRACT

The present disclosure relates to a method of receiving a data unit by a receiver in a wireless communication system. In particular, the method includes the steps of: receiving the data unit including a payload; and decompressing a header of the payload based on both a first type header compression algorithm and a second type header compression algorithm.

7 Claims, 16 Drawing Sheets

(58) Field of Classification Search
CPC ....... H04L 47/196; H04L 47/26; H04L 47/36; H04L 47/762; H04L 47/822; H04L 47/826; H04L 49/00; H04L 49/9057; H04L 5/003; H04L 63/06; H04L 65/1016; H04L 67/2828; H04L 69/08; H04L 69/164; H04L 69/323; H04L 69/40; H04L 12/18; H04L 12/42; H04L 1/0025; H04L 1/0041; H04L 1/0057; H04L 1/0071; H04L 1/0075; H04L 1/0079; H04L 1/0083; H04L 1/1664; H04L 1/1671; H04L 1/18; H04L 2001/0098; H04L 2463/101; H04L 27/122; H04L 27/2601; H04L 27/2627; H04L 29/08018; H04L 41/0226; H04L 45/745; H04L 47/10; H04L 47/18; H04L 47/193; H04L 47/2433; H04L 47/2466; H04L 47/32; H04L 47/35; H04L 47/6275; H04L 47/801; H04L 5/0007; H04L 61/6018; H04L 61/6022; H04L 63/0209; H04L 63/029; H04L 63/04; H04L 63/0457; H04L 63/0485; H04L 63/061; H04L 63/068; H04L 63/08; H04L 65/1083; H04L 65/605; H04L 67/14; H04L 67/22; H04L 69/166; H04L 69/169; H04L 69/18; H04L 69/329; H04L 9/32; H04W 28/06; H04W 80/04; H04W 28/065; H04W 72/005; H04W 28/04; H04W 24/08; H04W 28/18; H04W 4/06; H04W 4/24; H04W 76/10; H04W 80/06; H04W 12/0013; H04W 72/04; H04W 72/10; H04W 24/00; H04W 28/0231; H04W 36/0011; H04W 36/08; H04W 40/02; H04W 72/00; H04W 72/044; H04W 72/0453; H04W 80/00; H04W 80/02; H04W 84/042; H04W 84/047; H04W 12/02; H04W 12/04; H04W 28/0273; H04W 28/0289; H04W 28/08; H04W 28/14; H04W 72/0446; H04W 76/11; H04W 84/12; H04W 88/12; H04W 88/182; H04W 92/10; H04N 21/64322; H04N 21/4345; H04N 21/2362; H04N 21/435; H04N 21/236; H04N 21/2381; H04N 21/2383; H04N 21/41407; H04N 21/4381; H04N 21/6131; H04N 21/235; H04N 21/6112; H04N 21/2389; H04N 21/434; H04N 21/4382; H04N 21/472; H04N 21/6143; H04N 5/4401; H04N 5/455; H04N 5/50; H04N 21/23605; H04N 21/23614; H04N 21/2385; H04N 21/4385; H04N 21/64315; H04N 21/00; H04N 21/234; H04N 21/438; H04B 7/0413; H04M 7/006

See application file for complete search history.

(56) References Cited

U.S. PATENT DOCUMENTS

| | | | | |
|---|---|---|---|---|
| 2002/0093938 | A1* | 7/2002 | Tourunen | H04L 69/16 370/349 |
| 2004/0107298 | A1* | 6/2004 | Westphal | H04L 69/04 709/247 |
| 2004/0199660 | A1* | 10/2004 | Liu | H04L 69/04 709/236 |
| 2006/0056404 | A1* | 3/2006 | Mueckenheim | H04L 65/608 370/389 |
| 2008/0186936 | A1* | 8/2008 | Chun | H04L 69/324 370/342 |
| 2011/0032952 | A1* | 2/2011 | Rochon | H04L 69/22 370/477 |
| 2013/0064177 | A1 | 3/2013 | Venkatachalam et al. | |
| 2014/0064180 | A1* | 3/2014 | Kotecha | H04W 80/04 370/328 |
| 2014/0369365 | A1* | 12/2014 | Denio | H04L 69/16 370/474 |
| 2016/0014004 | A1* | 1/2016 | Bergeron | H04L 47/196 709/224 |
| 2018/0183770 | A1* | 6/2018 | Wu | H04W 12/0013 |
| 2020/0037217 | A1* | 1/2020 | Shapiro | H04W 8/08 |

OTHER PUBLICATIONS

Vivo, "Scenarios on Ethernet header compression for supporting IIOT", 3GPP TSG-RAN WG2 Meeting #104, Nov. 12-16, 2018, R2-1816937.

Ana Raquel Silva Faria, "Robust Header Compression over IEEE 802 Networks", Proto, Sep. 2009.

* cited by examiner (a) User Plane Protocol Stack (b) Control Plane Protocol Stack (a) Example of PDSCH time domain resource allocation (b) Example of PUSCH time domain resource allocation

METHOD AND APPARATUS FOR PERFORMING DUAL HEADER COMPRESSION SCHEMES IN WIRELESS COMMUNICATION SYSTEM

Pursuant to 35 U.S.C. § 119(e), this application is a continuation of International Application PCT/KR2019/016908, with an international filing date of Dec. 3, 2019, which claims the benefit of Korean Application 10-2018-0167578 filing date of Dec. 21, 2018, the contents of which are hereby incorporated by reference herein in its entirety.

TECHNICAL FIELD

The present disclosure relates to a wireless communication system, and more particularly, to a method for performing dual header compression schemes in a wireless communication system and an apparatus therefor.

BACKGROUND ART

Introduction of new radio communication technologies has led to increases in the number of user equipments (UEs) to which a base station (BS) provides services in a prescribed resource region, and has also led to increases in the amount of data and control information that the BS transmits to the UEs. Due to typically limited resources available to the BS for communication with the UE(s), new techniques are needed by which the BS utilizes the limited radio resources to efficiently receive/transmit uplink/downlink data and/or uplink/downlink control information. In particular, overcoming delay or latency has become an important challenge in applications whose performance critically depends on delay/latency.

FIG. 1 illustrates an example of a communication system to which implementations of the present disclosure is applied.

Three main requirement categories for 5G include (1) a category of enhanced mobile broadband (eMBB), (2) a category of massive machine type communication (mMTC), and (3) a category of ultra-reliable and low latency communications (URLLC).

Partial use cases may require a plurality of categories for optimization and other use cases may focus only upon one key performance indicator (KPI). 5G supports such various use cases using a flexible and reliable method.

eMBB far surpasses basic mobile Internet access and covers abundant bidirectional work and media and entertainment applications in cloud and augmented reality. Data is one of 5G core motive forces and, in a 5G era, a dedicated voice service may not be provided for the first time. In 5G, it is expected that voice will be simply processed as an application program using data connection provided by a communication system. Main causes for increased traffic volume are due to an increase in the size of content and an increase in the number of applications requiring high data transmission rate. A streaming service (of audio and video), conversational video, and mobile Internet access will be more widely used as more devices are connected to the Internet. These many application programs require connectivity of an always turned-on state in order to push real-time information and alarm for users. Cloud storage and applications are rapidly increasing in a mobile communication platform and may be applied to both work and entertainment. The cloud storage is a special use case which accelerates growth of uplink data transmission rate. 5G is also used for remote work of cloud. When a tactile interface is used, 5G demands much lower end-to-end latency to maintain user good experience. Entertainment, for example, cloud gaming and video streaming, is another core element which increases demand for mobile broadband capability. Entertainment is essential for a smartphone and a tablet in any place including high mobility environments such as a train, a vehicle, and an airplane. Other use cases are augmented reality for entertainment and information search. In this case, the augmented reality requires very low latency and instantaneous data volume.

In addition, one of the most expected 5G use cases relates a function capable of smoothly connecting embedded sensors in all fields, i.e., mMTC. It is expected that the number of potential IoT devices will reach 204 hundred million up to the year of 2020. An industrial IoT is one of categories of performing a main role enabling a smart city, asset tracking, smart utility, agriculture, and security infrastructure through 5G.

URLLC includes a new service that will change industry through remote control of main infrastructure and an ultra-reliable/available low-latency link such as a self-driving vehicle. A level of reliability and latency is essential to control a smart grid, automatize industry, achieve robotics, and control and adjust a drone.

5G is a means of providing streaming evaluated as a few hundred megabits per second to gigabits per second and may complement fiber-to-the-home (FTTH) and cable-based broadband (or DOCSIS). Such fast speed is needed to deliver TV in resolution of 4K or more (6K, 8K, and more), as well as virtual reality and augmented reality. Virtual reality (VR) and augmented reality (AR) applications include almost immersive sports games. A specific application program may require a special network configuration. For example, for VR games, gaming companies need to incorporate a core server into an edge network server of a network operator in order to minimize latency.

Automotive is expected to be a new important motivated force in 5G together with many use cases for mobile communication for vehicles. For example, entertainment for passengers requires high simultaneous capacity and mobile broadband with high mobility. This is because future users continue to expect connection of high quality regardless of their locations and speeds. Another use case of an automotive field is an AR dashboard. The AR dashboard causes a driver to identify an object in the dark in addition to an object seen from a front window and displays a distance from the object and a movement of the object by overlapping information talking to the driver. In the future, a wireless module enables communication between vehicles, information exchange between a vehicle and supporting infrastructure, and information exchange between a vehicle and other connected devices (e.g., devices accompanied by a pedestrian). A safety system guides alternative courses of a behavior so that a driver may drive more safely drive, thereby lowering the danger of an accident. The next stage will be a remotely controlled or self-driven vehicle. This requires very high reliability and very fast communication between different self-driven vehicles and between a vehicle and infrastructure. In the future, a self-driven vehicle will perform all driving activities and a driver will focus only upon abnormal traffic that the vehicle cannot identify. Technical requirements of a self-driven vehicle demand ultra-low latency and ultra-high reliability so that traffic safety is increased to a level that cannot be achieved by human being.

A smart city and a smart home/building mentioned as a smart society will be embedded in a high-density wireless sensor network. A distributed network of an intelligent sensor will identify conditions for costs and energy-efficient maintenance of a city or a home. Similar configurations may be performed for respective households. All of temperature sensors, window and heating controllers, burglar alarms, and home appliances are wirelessly connected. Many of these sensors are typically low in data transmission rate, power, and cost. However, real-time HD video may be demanded by a specific type of device to perform monitoring.

Consumption and distribution of energy including heat or gas is distributed at a higher level so that automated control of the distribution sensor network is demanded. The smart grid collects information and connects the sensors to each other using digital information and communication technology so as to act according to the collected information. Since this information may include behaviors of a supply company and a consumer, the smart grid may improve distribution of fuels such as electricity by a method having efficiency, reliability, economic feasibility, production sustainability, and automation. The smart grid may also be regarded as another sensor network having low latency.

Mission critical application (e.g. e-health) is one of 5G use scenarios. A health part contains many application programs capable of enjoying benefit of mobile communication. A communication system may support remote treatment that provides clinical treatment in a faraway place. Remote treatment may aid in reducing a barrier against distance and improve access to medical services that cannot be continuously available in a faraway rural area. Remote treatment is also used to perform important treatment and save lives in an emergency situation. The wireless sensor network based on mobile communication may provide remote monitoring and sensors for parameters such as heart rate and blood pressure.

Wireless and mobile communication gradually becomes important in the field of an industrial application. Wiring is high in installation and maintenance cost. Therefore, a possibility of replacing a cable with reconstructible wireless links is an attractive opportunity in many industrial fields. However, in order to achieve this replacement, it is necessary for wireless connection to be established with latency, reliability, and capacity similar to those of the cable and management of wireless connection needs to be simplified. Low latency and a very low error probability are new requirements when connection to 5G is needed.

Logistics and freight tracking are important use cases for mobile communication that enables inventory and package tracking anywhere using a location-based information system. The use cases of logistics and freight typically demand low data rate but require location information with a wide range and reliability.

Referring to FIG. 1, the communication system 1 includes wireless devices, base stations (BSs), and a network. Although FIG. 1 illustrates a 5G network as an example of the network of the communication system 1, the implementations of the present disclosure are not limited to the 5G system, and can be applied to the future communication system beyond the 5G system.

The BSs and the network may be implemented as wireless devices and a specific wireless device 200*a* may operate as a BS/network node with respect to other wireless devices.

The wireless devices represent devices performing communication using radio access technology (RAT) (e.g., 5G New RAT (NR)) or Long-Term Evolution (LTE)) and may be referred to as communication/radio/5G devices. The wireless devices may include, without being limited to, a robot 100*a*, vehicles 100*b*-1 and 100*b*-2, an eXtended Reality (XR) device 100*c*, a hand-held device 100*d*, a home appliance 100*e*, an Internet of Things (IoT) device 100*f*, and an Artificial Intelligence (AI) device/server 400. For example, the vehicles may include a vehicle having a wireless communication function, an autonomous driving vehicle, and a vehicle capable of performing communication between vehicles. The vehicles may include an Unmanned Aerial Vehicle (UAV) (e.g., a drone). The XR device may include an Augmented Reality (AR)/Virtual Reality (VR)/Mixed Reality (MR) device and may be implemented in the form of a Head-Mounted Device (HMD), a Head-Up Display (HUD) mounted in a vehicle, a television, a smartphone, a computer, a wearable device, a home appliance device, a digital signage, a vehicle, a robot, etc. The hand-held device may include a smartphone, a smartpad, a wearable device (e.g., a smartwatch or a smartglasses), and a computer (e.g., a notebook). The home appliance may include a TV, a refrigerator, and a washing machine. The IoT device may include a sensor and a smartmeter.

In the present disclosure, the wireless devices 100*a* to 100*f* may be called user equipments (UEs). A user equipment (UE) may include, for example, a cellular phone, a smartphone, a laptop computer, a digital broadcast terminal, a personal digital assistant (PDA), a portable multimedia player (PMP), a navigation system, a slate personal computer (PC), a tablet PC, an ultrabook, a vehicle, a vehicle having an autonomous traveling function, a connected car, an unmanned aerial vehicle (UAV), an artificial intelligence (AI) module, a robot, an augmented reality (AR) device, a virtual reality (VR) device, a mixed reality (MR) device, a hologram device, a public safety device, an MTC device, an IoT device, a medical device, a FinTech device (or a financial device), a security device, a weather/environment device, a device related to a 5G service, or a device related to a fourth industrial revolution field. The unmanned aerial vehicle (UAV) may be, for example, an aircraft aviated by a wireless control signal without a human being onboard. The VR device may include, for example, a device for implementing an object or a background of the virtual world. The AR device may include, for example, a device implemented by connecting an object or a background of the virtual world to an object or a background of the real world. The MR device may include, for example, a device implemented by merging an object or a background of the virtual world into an object or a background of the real world. The hologram device may include, for example, a device for implementing a stereoscopic image of 360 degrees by recording and reproducing stereoscopic information, using an interference phenomenon of light generated when two laser lights called holography meet. The public safety device may include, for example, an image relay device or an image device that is wearable on the body of a user. The MTC device and the IoT device may be, for example, devices that do not require direct human intervention or manipulation. For example, the MTC device and the IoT device may include smartmeters, vending machines, thermometers, smartbulbs, door locks, or various sensors. The medical device may be, for example, a device used for the purpose of diagnosing, treating, relieving, curing, or preventing disease. For example, the medical device may be a device used for the purpose of diagnosing, treating, relieving, or correcting injury or impairment. For example, the medical device may be a device used for the purpose of inspecting, replacing, or modifying a structure or a function. For example, the medical device may be a device used for the purpose of adjusting pregnancy. For example, the medical device may include a device for treatment, a device for operation, a device for (in vitro) diagnosis, a hearing aid, or a device for procedure. The security device may be, for example, a device installed to prevent a danger that may arise and to maintain safety. For example, the security device may be a camera, a CCTV, a recorder, or a black box. The FinTech device may be, for example, a device capable of providing a financial service such as mobile payment. For example, the FinTech device may include a payment device or a point of sales (POS) system. The weather/environment device may include, for example, a device for monitoring or predicting a weather/environment.

The wireless devices 100a to 100f may be connected to the network 300 via the BSs 200. An AI technology may be applied to the wireless devices 100a to 100f and the wireless devices 100a to 100f may be connected to the AI server 400 via the network 300. The network 300 may be configured using a 3G network, a 4G (e.g., LTE) network, a 5G (e.g., NR) network, and a beyond-5G network. Although the wireless devices 100a to 100f may communicate with each other through the BSs 200/network 300, the wireless devices 100a to 100f may perform direct communication (e.g., sidelink communication) with each other without passing through the BSs/network. For example, the vehicles 100b-1 and 100b-2 may perform direct communication (e.g. Vehicle-to-Vehicle (V2V)/Vehicle-to-everything (V2X) communication). The IoT device (e.g., a sensor) may perform direct communication with other IoT devices (e.g., sensors) or other wireless devices 100a to 100f.

Wireless communication/connections 150a and 150b may be established between the wireless devices 100a to 100f/BS 200-BS 200. Herein, the wireless communication/connections may be established through various RATs (e.g., 5G NR) such as uplink/downlink communication 150a and sidelink communication 150b (or D2D communication). The wireless devices and the BSs/the wireless devices may transmit/receive radio signals to/from each other through the wireless communication/connections 150a and 150b. For example, the wireless communication/connections 150a and 150b may transmit/receive signals through various physical channels. To this end, at least a part of various configuration information configuring processes, various signal processing processes (e.g., channel encoding/decoding, modulation/demodulation, and resource mapping/demapping), and resource allocating processes, for transmitting/receiving radio signals, may be performed based on the various proposals of the present disclosure.

DISCLOSURE

Technical Problem

Accordingly, an object of the present disclosure is to performing dual header compression schemes in a wireless communication system and an apparatus therefor.

Technical Solution

The object of the present disclosure can be achieved by the method for receiving a data unit by a receiver in a wireless communication system comprising steps of receiving the data unit including a payload; and decompressing a header of the payload based on both a first type header compression algorithm and a second type header compression algorithm.

Similarly, the object of the present disclosure can be achieved by the method for transmitting a data unit by a transmitter in a wireless communication system comprising steps of compressing a header of a payload based on both a first type header compression algorithm and a second type header compression algorithm; and transmitting the data unit including a header compressed payload Further, it is suggested a wireless node in a wireless communication system comprising a memory; and at least one processor coupled to the memory. More specifically, the at least one processor is configured to receive a data unit including a payload; and decompress a header of the payload based on both a first type header compression algorithm and a second type header compression algorithm. Especially, the at least one processor is further configured to implement at least one advanced driver assistance system (ADAS) function based on signals that control the wireless node Preferably, the data unit includes a field indicating that both the first type header compression algorithm and the second type header compression algorithm are applied to the header of the payload.

Preferably, the data unit is a Packet Data Convergence Protocol (PDCP) protocol data unit (PDU) including a sequence number (SN), and the PDCP PDU further includes a field indicating whether the payload is data information or control information.

Preferably, the first type header compression algorithm is Robust Header Compression (ROHC) algorithm and the second type header compression algorithm is Ethernet Header Compression (EHC) algorithm.

Advantageous Effects

According to the aforementioned embodiments of the present disclosure, the wireless node can apply multiple header compression schemes efficiently.

Effects obtainable from the present disclosure may be non-limited by the above mentioned effect. And, other unmentioned effects can be clearly understood from the following description by those having ordinary skill in the technical field to which the present disclosure pertains.

DESCRIPTION OF DRAWINGS

The accompanying drawings, which are included to provide a further understanding of the invention, illustrate embodiments of the invention and together with the description serve to explain the principle of the invention.

BEST MODE

Figure 1:
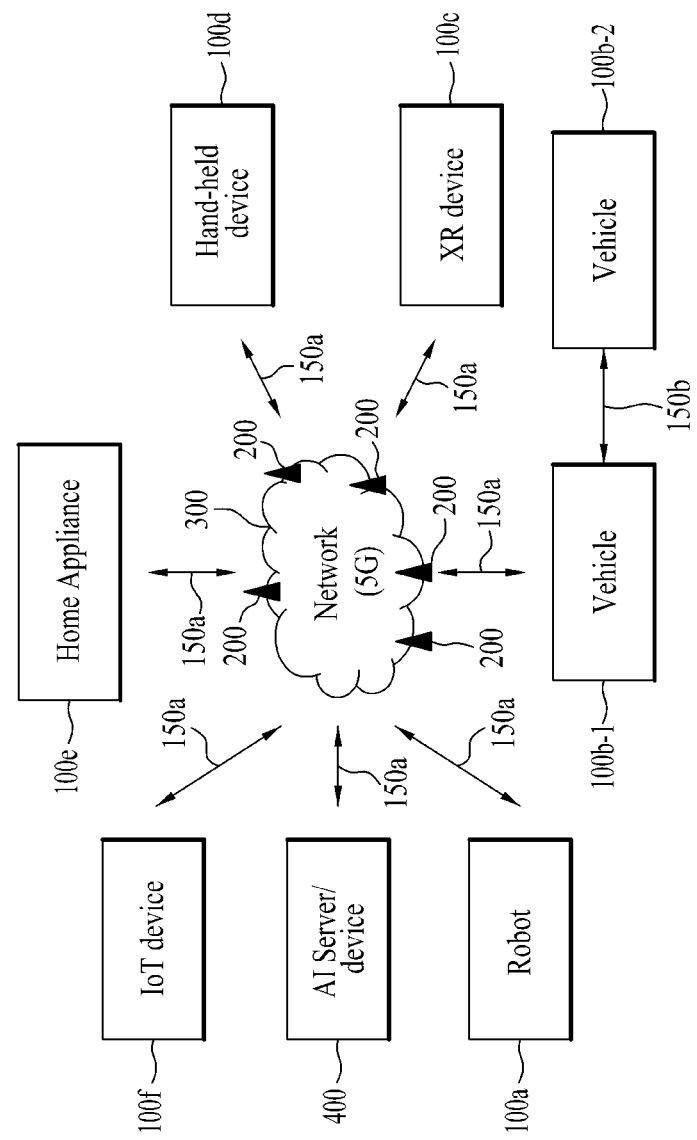
FIG. 1 illustrates an example of a communication system 1 to which implementations of the present disclosure is applied.

Reference will now be made in detail to the exemplary implementations of the present disclosure, examples of which are illustrated in the accompanying drawings. The detailed description, which will be given below with reference to the accompanying drawings, is intended to explain exemplary implementations of the present disclosure, rather than to show the only implementations that can be implemented according to the disclosure. The following detailed description includes specific details in order to provide a thorough understanding of the present disclosure. However, it will be apparent to those skilled in the art that the present disclosure may be practiced without such specific details.

The following techniques, apparatuses, and systems may be applied to a variety of wireless multiple access systems. Examples of the multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multicarrier frequency division multiple access (MC-FDMA) system. CDMA may be embodied through radio technology such as universal terrestrial radio access (UTRA) or CDMA2000. TDMA may be embodied through radio technology such as global system for mobile communications (GSM), general packet radio service (GPRS), or enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802.20, or evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in DL and SC-FDMA in UL. LTE-advanced (LTE-A) is an evolved version of 3GPP LTE.

For convenience of description, implementations of the present disclosure are mainly described in regards to a 3GPP based wireless communication system. However, the technical features of the present disclosure are not limited thereto. For example, although the following detailed description is given based on a mobile communication system corresponding to a 3GPP based wireless communication system, aspects of the present disclosure that are not limited to 3GPP based wireless communication system are applicable to other mobile communication systems. For terms and technologies which are not specifically described among the terms of and technologies employed in the present disclosure, the wireless communication standard documents published before the present disclosure may be referenced. For example, the following documents may be referenced.

3GPP LTE
3GPP TS 36.211: Physical channels and modulation
3GPP TS 36.212: Multiplexing and channel coding
3GPP TS 36.213: Physical layer procedures
3GPP TS 36.214: Physical layer; Measurements
3GPP TS 36.300: Overall description
3GPP TS 36.304: User Equipment (UE) procedures in idle mode
3GPP TS 36.314: Layer 2—Measurements
3GPP TS 36.321: Medium Access Control (MAC) protocol
3GPP TS 36.322: Radio Link Control (RLC) protocol
3GPP TS 36.323: Packet Data Convergence Protocol (PDCP)
3GPP TS 36.331: Radio Resource Control (RRC) protocol
3GPP NR (e.g. 5G)
3GPP TS 38.211: Physical channels and modulation
3GPP TS 38.212: Multiplexing and channel coding
3GPP TS 38.213: Physical layer procedures for control
3GPP TS 38.214: Physical layer procedures for data
3GPP TS 38.215: Physical layer measurements
3GPP TS 38.300: Overall description
3GPP TS 38.304: User Equipment (UE) procedures in idle mode and in RRC inactive state
3GPP TS 38.321: Medium Access Control (MAC) protocol
3GPP TS 38.322: Radio Link Control (RLC) protocol
3GPP TS 38.323: Packet Data Convergence Protocol (PDCP)
3GPP TS 38.331: Radio Resource Control (RRC) protocol
3GPP TS 37.324: Service Data Adaptation Protocol (SDAP)
3GPP TS 37.340: Multi-connectivity; Overall description In the present disclosure, a user equipment (UE) may be a fixed or mobile device. Examples of the UE include various devices that transmit and receive user data and/or various kinds of control information to and from a base station (BS). In the present disclosure, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB), a base transceiver system (BTS), an access point (AP), a processing server (PS), etc. Especially, a BS of the UMTS is referred to as a NB, a BS of the enhanced packet core (EPC)/long term evolution (LTE) system is referred to as an eNB, and a BS of the new radio (NR) system is referred to as a gNB.

In the present disclosure, a node refers to a point capable of transmitting/receiving a radio signal through communication with a UE. Various types of BSs may be used as nodes irrespective of the terms thereof. For example, a BS, a node B (NB), an e-node B (eNB), a pico-cell eNB (PeNB), a home eNB (HeNB), a relay, a repeater, etc. may be a node. In addition, the node may not be a BS. For example, the node may be a radio remote head (RRH) or a radio remote unit (RRU). The RRH or RRU generally has a lower power level than a power level of a BS. Since the RRH or RRU (hereinafter, RRH/RRU) is generally connected to the BS through a dedicated line such as an optical cable, cooperative communication between RRH/RRU and the BS can be smoothly performed in comparison with cooperative communication between BSs connected by a radio line. At least one antenna is installed per node. The antenna may include a physical antenna or an antenna port or a virtual antenna.

In the present disclosure, the term "cell" may refer to a geographic area to which one or more nodes provide a communication system, or refer to radio resources. A "cell" of a geographic area may be understood as coverage within which a node can provide service using a carrier and a "cell" as radio resources (e.g. time-frequency resources) is associated with bandwidth (BW) which is a frequency range configured by the carrier. The "cell" associated with the radio resources is defined by a combination of downlink resources and uplink resources, for example, a combination of a downlink (DL) component carrier (CC) and an uplink (UL) CC. The cell may be configured by downlink resources only, or may be configured by downlink resources and uplink resources. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of radio resources used by the node. Accordingly, the term "cell" may be used to represent service coverage of the node sometimes, radio resources at other times, or a range that signals using the radio resources can reach with valid strength at other times.

In the present disclosure, a physical downlink control channel (PDCCH), and a physical downlink shared channel (PDSCH) refer to a set of time-frequency resources or resource elements (REs) carrying downlink control information (DCI), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively.

In carrier aggregation (CA), two or more CCs are aggregated. A UE may simultaneously receive or transmit on one or multiple CCs depending on its capabilities. CA is supported for both contiguous and non-contiguous CCs. When CA is configured the UE only has one radio resource control (RRC) connection with the network. At RRC connection establishment/re-establishment/handover, one serving cell provides the non-access stratum (NAS) mobility information, and at RRC connection re-establishment/handover, one serving cell provides the security input. This cell is referred to as the Primary Cell (PCell). The PCell is a cell, operating on the primary frequency, in which the UE either performs the initial connection establishment procedure or initiates the connection re-establishment procedure. Depending on UE capabilities, Secondary Cells (SCells) can be configured to form together with the PCell a set of serving cells. An SCell is a cell providing additional radio resources on top of Special Cell. The configured set of serving cells for a UE therefore always consists of one PCell and one or more SCells. In the present disclosure, for dual connectivity (DC) operation, the term "special Cell" refers to the PCell of the master cell group (MCG) or the PSCell of the secondary cell group (SCG), and otherwise the term Special Cell refers to the PCell. An SpCell supports physical uplink control channel (PUCCH) transmission and contention-based random access, and is always activated. The MCG is a group of serving cells associated with a master node, comprising of the SpCell (PCell) and optionally one or more SCells. The SCG is the subset of serving cells associated with a secondary node, comprising of the PSCell and zero or more SCells, for a UE configured with DC. For a UE in RRC_CONNECTED not configured with CA/DC there is only one serving cell comprising of the PCell. For a UE in RRC_CONNECTED configured with CA/DC the term "serving cells" is used to denote the set of cells comprising of the SpCell(s) and all SCells.

The MCG is a group of serving cells associated with a master BS which terminates at least S1-MME, and the SCG is a group of serving cells associated with a secondary BS that is providing additional radio resources for the UE but is not the master BS. The SCG includes a primary SCell (PSCell) and optionally one or more SCells. In DC, two MAC entities are configured in the UE: one for the MCG and one for the SCG. Each MAC entity is configured by RRC with a serving cell supporting PUCCH transmission and contention based Random Access. In the present disclosure, the term SpCell refers to such cell, whereas the term SCell refers to other serving cells. The term SpCell either refers to the PCell of the MCG or the PSCell of the SCG depending on if the MAC entity is associated to the MCG or the SCG, respectively.

In the present disclosure, monitoring a channel refers to attempting to decode the channel. For example, monitoring a physical downlink control channel (PDCCH) refers to attempting to decode PDCCH(s) (or PDCCH candidates).

In the present disclosure, "C-RNTI" refers to a cell RNTI, "SI-RNTI" refers to a system information RNTI, "P-RNTI" refers to a paging RNTI, "RA-RNTI" refers to a random access RNTI, "SC-RNTI" refers to a single cell RNTI", "SL-RNTI" refers to a sidelink RNTI, "SPS C-RNTI" refers to a semi-persistent scheduling C-RNTI, and "CS-RNTI" refers to a configured scheduling RNTI.

Figure 2:
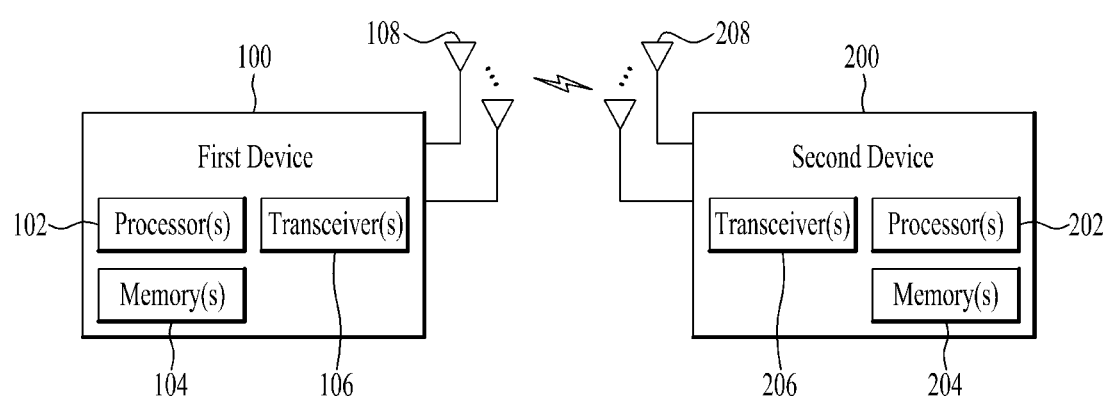
FIG. 2 is a block diagram illustrating examples of communication devices which can perform a method according to the present disclosure.

FIG. 2 is a block diagram illustrating examples of communication devices which can perform a method according to the present disclosure.

Referring to FIG. 2, a first wireless device 100 and a second wireless device 200 may transmit/receive radio signals to/from an external device through a variety of RATs (e.g., LTE and NR). In FIG. 2, {the first wireless device 100 and the second wireless device 200} may correspond to {the wireless device 100a to 100f and the BS 200} and/or {the wireless device 100a to 100f and the wireless device 100a to 100f} of FIG. 1.

The first wireless device 100 may include one or more processors 102 and one or more memories 104 and additionally further include one or more transceivers 106 and/or one or more antennas 108. The processor(s) 102 may control the memory(s) 104 and/or the transceiver(s) 106 and may be configured to implement the functions, procedures, and/or methods described in the present disclosure. For example, the processor(s) 102 may process information within the memory(s) 104 to generate first information/signals and then transmit radio signals including the first information/signals through the transceiver(s) 106. The processor(s) 102 may receive radio signals including second information/signals through the transceiver 106 and then store information obtained by processing the second information/signals in the memory(s) 104. The memory(s) 104 may be connected to the processor(s) 102 and may store a variety of information related to operations of the processor(s) 102. For example, the memory(s) 104 may store software code including commands for performing a part or the entirety of processes controlled by the processor(s) 102 or for performing the procedures and/or methods described in the present disclosure. Herein, the processor(s) 102 and the memory(s) 104 may be a part of a communication modem/circuit/chip designed to implement RAT (e.g., LTE or NR). The transceiver(s) 106 may be connected to the processor(s) 102 and transmit and/or receive radio signals through one or more antennas 108. Each of the transceiver(s) 106 may include a transmitter and/or a receiver. The transceiver(s) 106 may be interchangeably used with radio frequency (RF) unit(s). In the present disclosure, the wireless device may represent a communication modem/circuit/chip.

The second wireless device 200 may include one or more processors 202 and one or more memories 204 and additionally further include one or more transceivers 206 and/or one or more antennas 208. The processor(s) 202 may control the memory(s) 204 and/or the transceiver(s) 206 and may be configured to implement the functions, procedures, and/or methods described in the present disclosure. For example, the processor(s) 202 may process information within the memory(s) 204 to generate third information/signals and then transmit radio signals including the third information/signals through the transceiver(s) 206. The processor(s) 202 may receive radio signals including fourth information/signals through the transceiver(s) 106 and then store information obtained by processing the fourth information/signals in the memory(s) 204. The memory(s) 204 may be connected to the processor(s) 202 and may store a variety of information related to operations of the processor(s) 202. For example, the memory(s) 204 may store software code including commands for performing a part or the entirety of processes controlled by the processor(s) 202 or for performing the procedures and/or methods described in the present disclosure. Herein, the processor(s) 202 and the memory(s) 204 may be a part of a communication modem/circuit/chip designed to implement RAT (e.g., LTE or NR). The transceiver(s) 206 may be connected to the processor(s) 202 and transmit and/or receive radio signals through one or more antennas 208. Each of the transceiver(s) 206 may include a transmitter and/or a receiver. The transceiver(s) 206 may be interchangeably used with RF unit(s). In the present disclosure, the wireless device may represent a communication modem/circuit/chip.

Hereinafter, hardware elements of the wireless devices 100 and 200 will be described more specifically. One or more protocol layers may be implemented by, without being limited to, one or more processors 102 and 202. For example, the one or more processors 102 and 202 may implement one or more layers (e.g., functional layers such as PHY, MAC, RLC, PDCP, RRC, and SDAP). The one or more processors 102 and 202 may generate one or more Protocol Data Units (PDUs) and/or one or more Service Data Unit (SDUs) according to the functions, procedures, proposals, and/or methods disclosed in the present disclosure. The one or more processors 102 and 202 may generate messages, control information, data, or information according to the functions, procedures, proposals, and/or methods disclosed in the present disclosure. The one or more processors 102 and 202 may generate signals (e.g., baseband signals) including PDUs, SDUs, messages, control information, data, or information according to the functions, procedures, proposals, and/or methods disclosed in the present disclosure and provide the generated signals to the one or more transceivers 106 and 206. The one or more processors 102 and 202 may receive the signals (e.g., baseband signals) from the one or more transceivers 106 and 206 and acquire the PDUs, SDUs, messages, control information, data, or information according to the functions, procedures, proposals, and/or methods disclosed in the present disclosure.

The one or more processors 102 and 202 may be referred to as controllers, microcontrollers, microprocessors, or microcomputers. The one or more processors 102 and 202 may be implemented by hardware, firmware, software, or a combination thereof. As an example, one or more Application Specific Integrated Circuits (ASICs), one or more Digital Signal Processors (DSPs), one or more Digital Signal Processing Devices (DSPDs), one or more Programmable Logic Devices (PLDs), or one or more Field Programmable Gate Arrays (FPGAs) may be included in the one or more processors 102 and 202. The functions, procedures, proposals, and/or methods disclosed in the present disclosure may be implemented using firmware or software and the firmware or software may be configured to include the modules, procedures, or functions. Firmware or software configured to perform the functions, procedures, proposals, and/or methods disclosed in the present disclosure may be included in the one or more processors 102 and 202 or stored in the one or more memories 104 and 204 so as to be driven by the one or more processors 102 and 202. The functions, procedures, proposals, and/or methods disclosed in the present disclosure may be implemented using firmware or software in the form of code, commands, and/or a set of commands.

The one or more memories 104 and 204 may be connected to the one or more processors 102 and 202 and store various types of data, signals, messages, information, programs, code, instructions, and/or commands. The one or more memories 104 and 204 may be configured by Read-Only Memories (ROMs), Random Access Memories (RAMs), Electrically Erasable Programmable Read-Only Memories (EPROMs), flash memories, hard drives, registers, cash memories, computer-readable storage media, and/or combinations thereof. The one or more memories 104 and 204 may be located at the interior and/or exterior of the one or more processors 102 and 202. The one or more memories 104 and 204 may be connected to the one or more processors 102 and 202 through various technologies such as wired or wireless connection.

The one or more transceivers 106 and 206 may transmit user data, control information, and/or radio signals/channels, mentioned in the methods and/or operational flowcharts of the present disclosure, to one or more other devices. The one or more transceivers 106 and 206 may receive user data, control information, and/or radio signals/channels, mentioned in the functions, procedures, proposals, methods, and/or operational flowcharts disclosed in the present disclosure, from one or more other devices. For example, the one or more transceivers 106 and 206 may be connected to the one or more processors 102 and 202 and transmit and receive radio signals. For example, the one or more processors 102 and 202 may perform control so that the one or more transceivers 106 and 206 may transmit user data, control information, or radio signals to one or more other devices. The one or more processors 102 and 202 may perform control so that the one or more transceivers 106 and 206 may receive user data, control information, or radio signals from one or more other devices. The one or more transceivers 106 and 206 may be connected to the one or more antennas 108 and 208 and the one or more transceivers 106 and 206 may be configured to transmit and receive user data, control information, and/or radio signals/channels, mentioned in the functions, procedures, proposals, methods, and/or operational flowcharts disclosed in the present disclosure, through the one or more antennas 108 and 208. In the present disclosure, the one or more antennas may be a plurality of physical antennas or a plurality of logical antennas (e.g., antenna ports). The one or more transceivers 106 and 206 may convert received radio signals/channels etc. from RF band signals into baseband signals in order to process received user data, control information, radio signals/channels, etc. using the one or more processors 102 and 202. The one or more transceivers 106 and 206 may convert the user data, control information, radio signals/channels, etc. processed using the one or more processors 102 and 202 from the base band signals into the RF band signals. To this end, the one or more transceivers 106 and 206 may include (analog) oscillators and/or filters. For example, the transceivers 106 and 206 can up-convert OFDM baseband signals to a carrier frequency by their (analog) oscillators and/or filters under the control of the processors 102 and 202 and transmit the up-converted OFDM signals at the carrier frequency. The transceivers 106 and 206 may receive OFDM signals at a carrier frequency and down-convert the OFDM signals into OFDM baseband signals by their (analog) oscillators and/or filters under the control of the transceivers 102 and 202.

In the implementations of the present disclosure, a UE may operate as a transmitting device in uplink (UL) and as a receiving device in downlink (DL). In the implementations of the present disclosure, a BS may operate as a receiving device in UL and as a transmitting device in DL. Hereinafter, for convenience of description, it is mainly assumed that the first wireless device 100 acts as the UE, and the second wireless device 200 acts as the BS, unless otherwise mentioned or described. For example, the processor(s) 102 connected to, mounted on or launched in the first wireless device 100 may be configured to perform the UE behaviour according to an implementation of the present disclosure or control the transceiver(s) 106 to perform the UE behaviour according to an implementation of the present disclosure. The processor(s) 202 connected to, mounted on or launched in the second wireless device 200 may be configured to perform the BS behaviour according to an implementation of the present disclosure or control the transceiver(s) 206 to perform the BS behaviour according to an implementation of the present disclosure.

Figure 3:
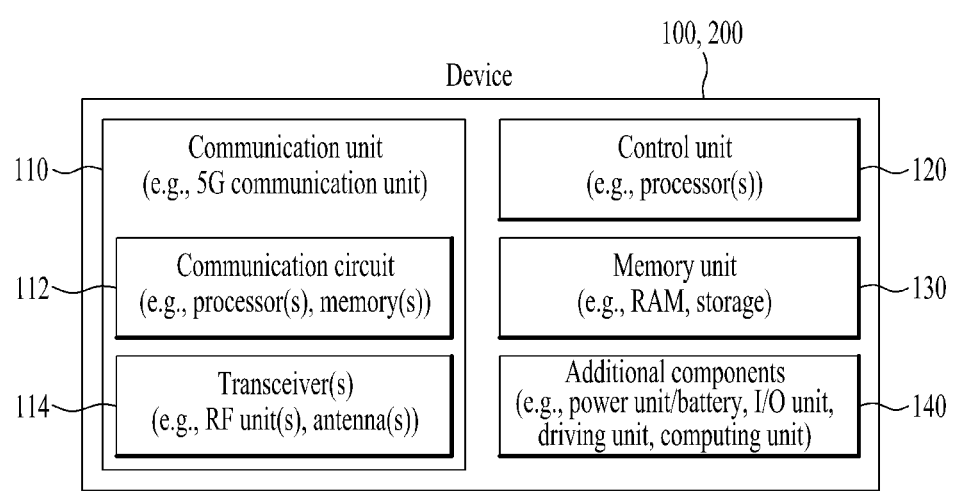
FIG. 3 illustrates another example of a wireless device which can perform implementations of the present disclosure.

FIG. 3 illustrates another example of a wireless device which can perform implementations of the present disclosure. The wireless device may be implemented in various forms according to a use-case/service (refer to FIG. 1).

Referring to FIG. 3, wireless devices 100 and 200 may correspond to the wireless devices 100 and 200 of FIG. 2 and may be configured by various elements, components, units/portions, and/or modules. For example, each of the wireless devices 100 and 200 may include a communication unit 110, a control unit 120, a memory unit 130, and additional components 140. The communication unit may include a communication circuit 112 and transceiver(s) 114. For example, the communication circuit 112 may include the one or more processors 102 and 202 of FIG. 2 and/or the one or more memories 104 and 204 of FIG. 2. For example, the transceiver(s) 114 may include the one or more transceivers 106 and 206 of FIG. 2 and/or the one or more antennas 108 and 208 of FIG. 2. The control unit 120 is electrically connected to the communication unit 110, the memory 130, and the additional components 140 and controls overall operation of the wireless devices. For example, the control unit 120 may control an electric/mechanical operation of the wireless device based on programs/code/commands/information stored in the memory unit 130. The control unit 120 may transmit the information stored in the memory unit 130 to the exterior (e.g., other communication devices) via the communication unit 110 through a wireless/wired interface or store, in the memory unit 130, information received through the wireless/wired interface from the exterior (e.g., other communication devices) via the communication unit 110.

The additional components 140 may be variously configured according to types of wireless devices. For example, the additional components 140 may include at least one of a power unit/battery, input/output (I/O) unit (e.g. audio I/O port, video I/O port), a driving unit, and a computing unit. The wireless device may be implemented in the form of, without being limited to, the robot (100a of FIG. 1), the vehicles (100b-1 and 100b-2 of FIG. 1), the XR device (100c of FIG. 1), the hand-held device (100d of FIG. 1), the home appliance (100e of FIG. 1), the IoT device (100f of FIG. 1), a digital broadcast terminal, a hologram device, a public safety device, an MTC device, a medicine device, a Fintech device (or a finance device), a security device, a climate/environment device, the AI server/device (400 of FIG. 1), the BSs (200 of FIG. 1), a network node, etc. The wireless device may be used in a mobile or fixed place according to a use-example/service.

In FIG. 3, the entirety of the various elements, components, units/portions, and/or modules in the wireless devices 100 and 200 may be connected to each other through a wired interface or at least a part thereof may be wirelessly connected through the communication unit 110. For example, in each of the wireless devices 100 and 200, the control unit 120 and the communication unit 110 may be connected by wire and the control unit 120 and first units (e.g., 130 and 140) may be wirelessly connected through the communication unit 110. Each element, component, unit/portion, and/or module within the wireless devices 100 and 200 may further include one or more elements. For example, the control unit 120 may be configured by a set of one or more processors. As an example, the control unit 120 may be configured by a set of a communication control processor, an application processor, an electronic control unit (ECU), a graphical processing unit, and a memory control processor. As another example, the memory 130 may be configured by a random access memory (RAM), a dynamic RAM (DRAM), a read only memory (ROM)), a flash memory, a volatile memory, a non-volatile memory, and/or a combination thereof.

Figure 4:
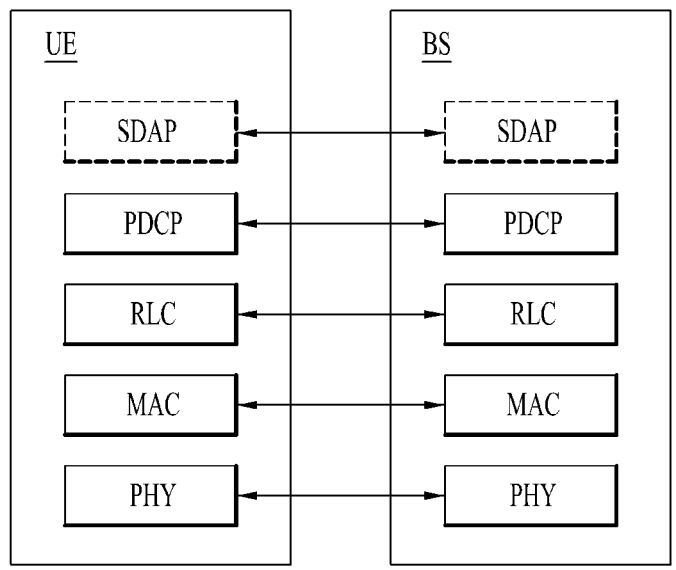
FIG. 4 illustrates an example of protocol stacks in a third generation partnership project (3GPP) based wireless communication system.
Figure 4:
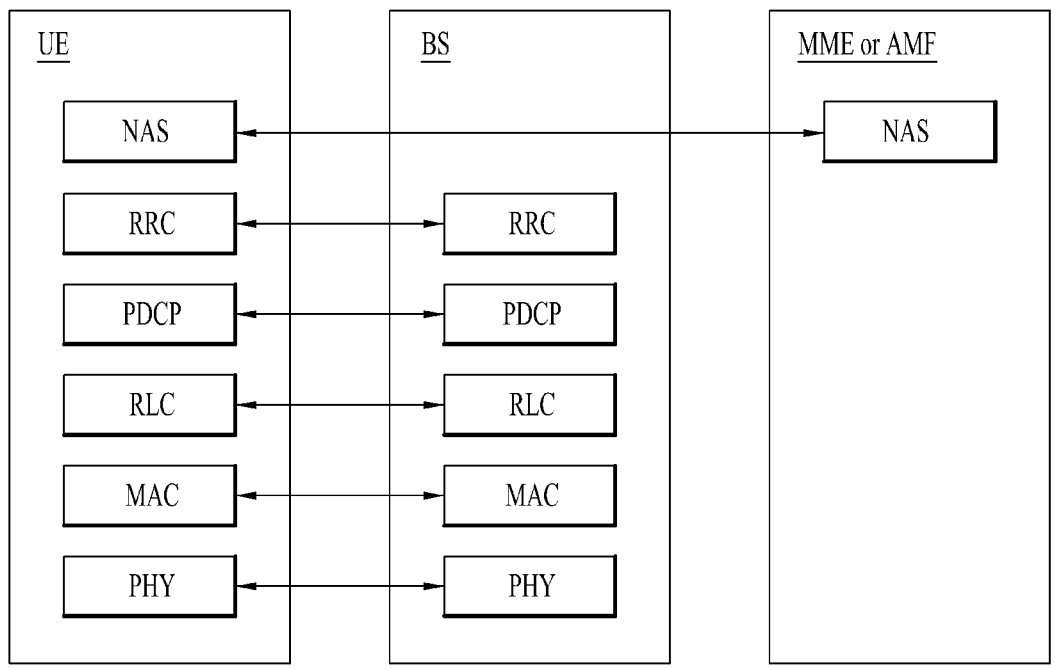

FIG. 4 illustrates an example of protocol stacks in a 3GPP based wireless communication system.

In particular, FIG. 4(*a*) illustrates an example of a radio interface user plane protocol stack between a UE and a base station (BS) and FIG. 4(*b*) illustrates an example of a radio interface control plane protocol stack between a UE and a BS. The control plane refers to a path through which control messages used to manage call by a UE and a network are transported. The user plane refers to a path through which data generated in an application layer, for example, voice data or Internet packet data are transported. Referring to FIG. 4(*a*), the user plane protocol stack may be divided into a first layer (Layer 1) (i.e., a physical (PHY) layer) and a second layer (Layer 2). Referring to FIG. 4(*b*), the control plane protocol stack may be divided into Layer 1 (i.e., a PHY layer), Layer 2, Layer 3 (e.g., a radio resource control (RRC) layer), and a non-access stratum (NAS) layer. Layer 1, Layer 2 and Layer 3 are referred to as an access stratum (AS).

The NAS control protocol is terminated in an access management function (AMF) on the network side, and performs functions such as authentication, mobility management, security control and etc.

In the 3GPP LTE system, the layer 2 is split into the following sublayers: medium access control (MAC), radio link control (RLC), and packet data convergence protocol (PDCP). In the 3GPP New Radio (NR) system, the layer 2 is split into the following sublayers: MAC, RLC, PDCP and SDAP. The PHY layer offers to the MAC sublayer transport channels, the MAC sublayer offers to the RLC sublayer logical channels, the RLC sublayer offers to the PDCP sublayer RLC channels, the PDCP sublayer offers to the SDAP sublayer radio bearers. The SDAP sublayer offers to 5G Core Network quality of service (QoS) flows.

In the 3GPP NR system, the main services and functions of SDAP include: mapping between a QoS flow and a data radio bearer; marking QoS flow ID (QFI) in both DL and UL packets. A single protocol entity of SDAP is configured for each individual PDU session.

In the 3GPP NR system, the main services and functions of the RRC sublayer include: broadcast of system information related to AS and NAS; paging initiated by 5G core (5GC) or NG-RAN; establishment, maintenance and release of an RRC connection between the UE and NG-RAN; security functions including key management; establishment, configuration, maintenance and release of signalling radio bearers (SRBs) and data radio bearers (DRBs); mobility functions (including: handover and context transfer; UE cell selection and reselection and control of cell selection and reselection; Inter-RAT mobility); QoS management functions; UE measurement reporting and control of the reporting; detection of and recovery from radio link failure; NAS message transfer to/from NAS from/to UE.

In the 3GPP NR system, the main services and functions of the PDCP sublayer for the user plane include: sequence numbering; header compression and decompression: ROHC only; transfer of user data; reordering and duplicate detection; in-order delivery; PDCP PDU routing (in case of split bearers); retransmission of PDCP SDUs; ciphering, deciphering and integrity protection; PDCP SDU discard; PDCP re-establishment and data recovery for RLC AM; PDCP status reporting for RLC AM; duplication of PDCP PDUs and duplicate discard indication to lower layers. The main services and functions of the PDCP sublayer for the control plane include: sequence numbering; ciphering, deciphering and integrity protection; transfer of control plane data; reordering and duplicate detection; in-order delivery; duplication of PDCP PDUs and duplicate discard indication to lower layers.

The RLC sublayer supports three transmission modes: Transparent Mode (TM); Unacknowledged Mode (UM); and Acknowledged Mode (AM). The RLC configuration is per logical channel with no dependency on numerologies and/or transmission durations. In the 3GPP NR system, the main services and functions of the RLC sublayer depend on the transmission mode and include: Transfer of upper layer PDUs; sequence numbering independent of the one in PDCP (UM and AM); error correction through ARQ (AM only); segmentation (AM and UM) and re-segmentation (AM only) of RLC SDUs; reassembly of SDU (AM and UM); duplicate detection (AM only); RLC SDU discard (AM and UM); RLC re-establishment; protocol error detection (AM only).

In the 3GPP NR system, the main services and functions of the MAC sublayer include: mapping between logical channels and transport channels; multiplexing/demultiplexing of MAC SDUs belonging to one or different logical channels into/from transport blocks (TB) delivered to/from the physical layer on transport channels; scheduling information reporting; error correction through HARQ (one HARQ entity per cell in case of carrier aggregation (CA)); priority handling between UEs by means of dynamic scheduling; priority handling between logical channels of one UE by means of logical channel prioritization; padding. A single MAC entity may support multiple numerologies, transmission timings and cells. Mapping restrictions in logical channel prioritization control which numerology(ies), cell(s), and transmission timing(s) a logical channel can use. Different kinds of data transfer services are offered by MAC. To accommodate different kinds of data transfer services, multiple types of logical channels are defined i.e. each supporting transfer of a particular type of information. Each logical channel type is defined by what type of information is transferred. Logical channels are classified into two groups: Control Channels and Traffic Channels. Control channels are used for the transfer of control plane information only, and traffic channels are used for the transfer of user plane information only. Broadcast Control Channel (BCCH) is a downlink logical channel for broadcasting system control information, paging Control Channel (PCCH) is a downlink logical channel that transfers paging information, system information change notifications and indications of ongoing PWS broadcasts, Common Control Channel (CCCH) is a logical channel for transmitting control information between UEs and network and used for UEs having no RRC connection with the network, and Dedicated Control Channel (DCCH) is a point-to-point bi-directional logical channel that transmits dedicated control information between a UE and the network and used by UEs having an RRC connection. Dedicated Traffic Channel (DTCH) is a point-to-point logical channel, dedicated to one UE, for the transfer of user information. A DTCH can exist in both uplink and downlink. In Downlink, the following connections between logical channels and transport channels exist: BCCH can be mapped to BCH; BCCH can be mapped to downlink shared channel (DL-SCH); PCCH can be mapped to PCH; CCCH can be mapped to DL-SCH; DCCH can be mapped to DL-SCH; and DTCH can be mapped to DL-SCH. In Uplink, the following connections between logical channels and transport channels exist: CCCH can be mapped to uplink shared channel (UL-SCH); DCCH can be mapped to UL-SCH; and DTCH can be mapped to UL-SCH.

Figure 5:
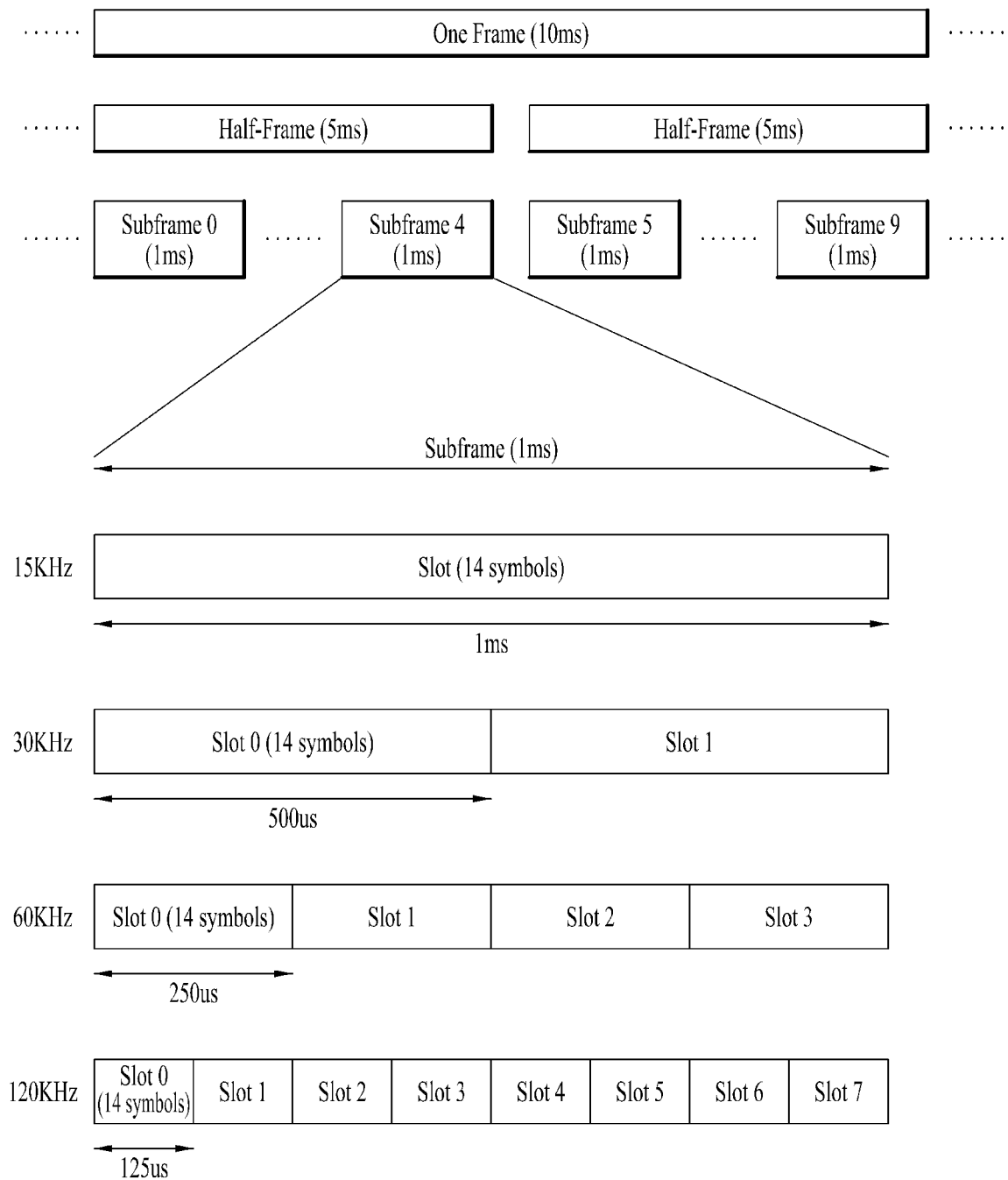
FIG. 5 illustrates an example of a frame structure in a 3GPP based wireless communication system.

FIG. 5 illustrates an example of a frame structure in a 3GPP based wireless communication system.

The frame structure illustrated in FIG. 5 is purely exemplary and the number of subframes, the number of slots, and/or the number of symbols in a frame may be variously changed. In the 3GPP based wireless communication system, OFDM numerologies (e.g., subcarrier spacing (SCS), transmission time interval (TTI) duration) may be differently configured between a plurality of cells aggregated for one UE. For example, if a UE is configured with different SCSs for cells aggregated for the cell, an (absolute time) duration of a time resource (e.g. a subframe, a slot, or a TTI) including the same number of symbols may be different among the aggregated cells. Herein, symbols may include OFDM symbols (or CP-OFDM symbols), SC-FDMA symbols (or discrete Fourier transform-spread-OFDM (DFT-s-OFDM) symbols).

Referring to FIG. 5, downlink and uplink transmissions are organized into frames. Each frame has $T_f$=10 ms duration. Each frame is divided into two half-frames, where each of the half-frames has 5 ms duration. Each half-frame consists of 5 subframes, where the duration $T_{sf}$ per subframe is 1 ms. Each subframe is divided into slots and the number of slots in a subframe depends on a subcarrier spacing. Each slot includes 14 or 12 OFDM symbols based on a cyclic prefix (CP). In a normal CP, each slot includes 14 OFDM symbols and, in an extended CP, each slot includes 12 OFDM symbols. The numerology is based on exponentially scalable subcarrier spacing $\Delta f=2^u*15$ kHz. The following table shows the number of OFDM symbols per slot, the number of slots per frame, and the number of slots per for the normal CP, according to the subcarrier spacing $\Delta f=2^u*15$ kHz.

TABLE 1

| u | $N^{slot}_{symb}$ | $N^{frame, u}_{slot}$ | $N^{subframe, u}_{slot}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

The following table shows the number of OFDM symbols per slot, the number of slots per frame, and the number of slots per for the extended CP, according to the subcarrier spacing $\Delta f=2u*15$ kHz.

TABLE 2

| u | $N^{slot}_{symb}$ | $N^{frame, u}_{slot}$ | $N^{subframe, u}_{slot}$ |
|---|---|---|---|
| 2 | 12 | 40 | 4 |

A slot includes plural symbols (e.g., 14 or 12 symbols) in the time domain. For each numerology (e.g. subcarrier spacing) and carrier, a resource grid of $N^{size,u}_{grid,x}*N^{RB}_{sc}$ subcarriers and $N^{subframe,u}_{symb}$ OFDM symbols is defined, starting at common resource block (CRB) $N^{start,u}_{grid}$ indicated by higher-layer signaling (e.g. radio resource control (RRC) signaling), where $N^{size,u}_{grid,x}$ is the number of resource blocks in the resource grid and the subscript x is DL for downlink and UL for uplink. $N^{RB}_{sc}$ is the number of subcarriers per resource blocks. In the 3GPP based wireless communication system, $N^{RB}_{sc}$ is 12 generally. There is one resource grid for a given antenna port p, subcarrier spacing configuration u, and transmission direction (DL or UL). The carrier bandwidth $N^{size,u}_{grid}$ for subcarrier spacing configuration u is given by the higher-layer parameter (e.g. RRC parameter). Each element in the resource grid for the antenna port p and the subcarrier spacing configuration u is referred to as a resource element (RE) and one complex symbol may be mapped to each RE. Each RE in the resource grid is uniquely identified by an index k in the frequency domain and an index l representing a symbol location relative to a reference point in the time domain. In the 3GPP based wireless communication system, a resource block is defined by 12 consecutive subcarriers in the frequency domain.

In the 3GPP NR system, resource blocks are classified into CRBs and physical resource blocks (PRBs). CRBs are numbered from 0 and upwards in the frequency domain for subcarrier spacing configuration u. The center of subcarrier 0 of CRB 0 for subcarrier spacing configuration u coincides with 'point A' which serves as a common reference point for resource block grids. In the 3GPP NR system, PRBs are defined within a bandwidth part (BWP) and numbered from 0 to $N^{size}_{BWP,i}-1$, where i is the number of the bandwidth part. The relation between the physical resource block $n_{PRB}$ in the bandwidth part i and the common resource block $n_{CRB}$ is as follows: $n_{PRB}=n_{CRB}+N^{size}_{BWP,i}$, where $N^{size}_{BWP,i}$ is the common resource block where bandwidth part starts relative to CRB 0. The BWP includes a plurality of consecutive resource blocks. A carrier may include a maximum of N (e.g., 5) BWPs. A UE may be configured with one or more BWPs on a given component carrier. Only one BWP among BWPs configured to the UE can active at a time. The active BWP defines the UE's operating bandwidth within the cell's operating bandwidth.

NR frequency bands are defined as 2 types of frequency range, FR1 and FR2. FR2 is may also called millimeter wave (mmW). The frequency ranges in which NR can operate are identified as described in Table 3.

TABLE 3

| Frequency Range designation | Corresponding frequency range | Subcarrier Spacing |
|---|---|---|
| FR1 | 450 MHz-7125 MHz | 15, 30, 60 kHz |
| FR2 | 24250 MHz-52600 MHz | 60, 120, 240 kHz |

Figure 6:
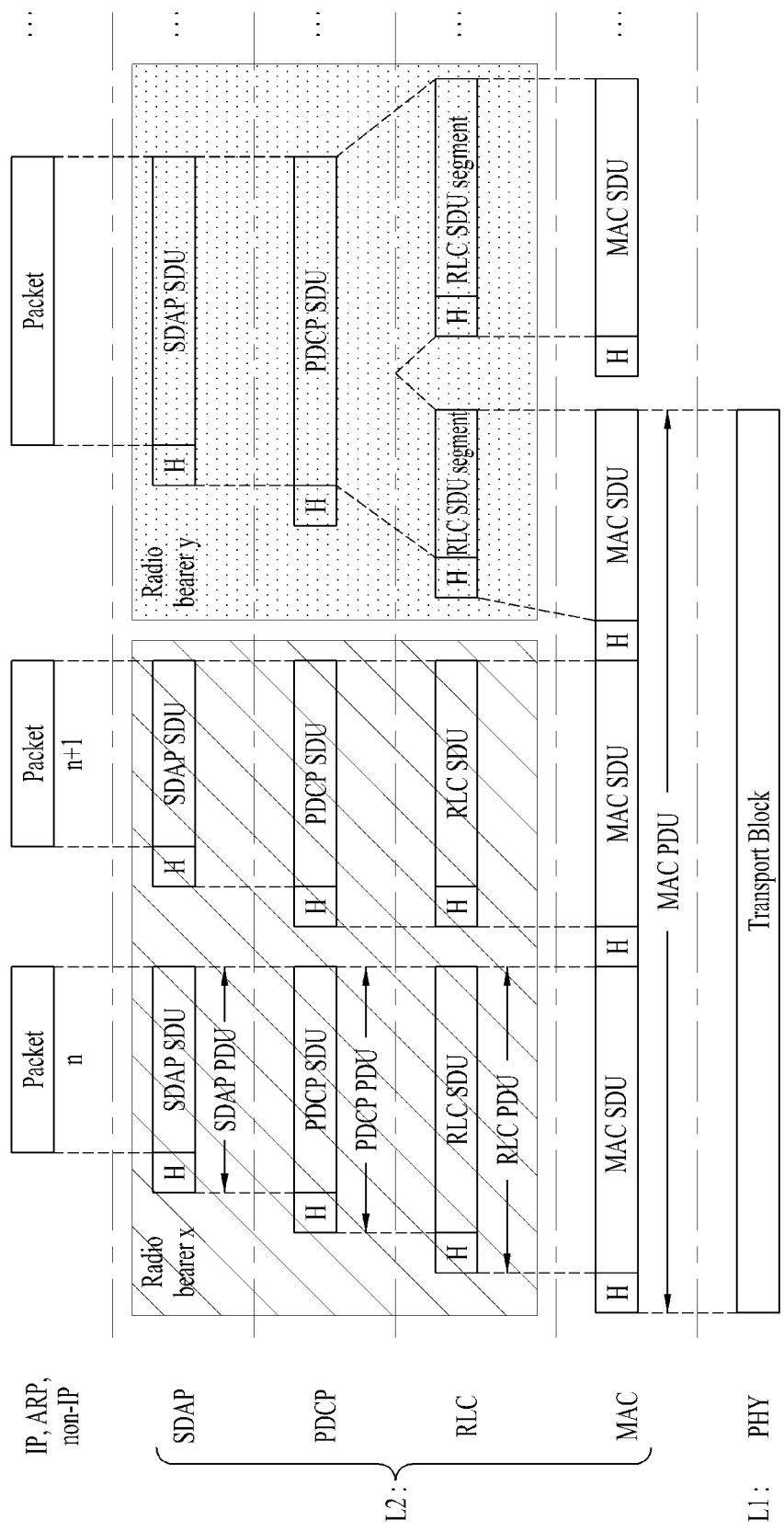
FIG. 6 illustrates a data flow example in the 3GPP new radio (NR) system.

FIG. 6 illustrates a data flow example in the 3GPP NR system.

In FIG. 6, "RB" denotes a radio bearer, and "H" denotes a header. Radio bearers are categorized into two groups: data radio bearers (DRB) for user plane data and signalling radio bearers (SRB) for control plane data. The MAC PDU is transmitted/received using radio resources through the PHY layer to/from an external device. The MAC PDU arrives to the PHY layer in the form of a transport block.

In the PHY layer, the uplink transport channels UL-SCH and RACH are mapped to physical uplink shared channel (PUSCH) and physical random access channel (PRACH), respectively, and the downlink transport channels DL-SCH, BCH and PCH are mapped to physical downlink shared channel (PDSCH), physical broad cast channel (PBCH) and PDSCH, respectively. In the PHY layer, uplink control information (UCI) is mapped to PUCCH, and downlink control information (DCI) is mapped to PDCCH. A MAC PDU related to UL-SCH is transmitted by a UE via a PUSCH based on an UL grant, and a MAC PDU related to DL-SCH is transmitted by a BS via a PDSCH based on a DL assignment.

According to 3GPP standard, Robust Header Compression (ROHC) can be configured in a PDCP entity. If the ROHC is configured, the IP headers can be compressed to 1-3 bytes, which could save a lot of radio resource. Firstly, the ROHC compressor in the transmitting PDCP entity sends a Full Header packet to a ROHC decompressor in the receiving PDCP entity to establish a header context in the ROHC decompressor. After that, the ROHC compressor compresses IP headers based on the header context by transmitting only varying fields of the header. In the ROHC decompressor, when it receives a compressed packet, it decompresses the compressed header based on the established header context.

The PDCP entities are located in the PDCP sublayer. Several PDCP entities may be defined for a UE. Each PDCP entity is carrying the data of one radio bearer. A PDCP entity is associated either to the control plane or the user plane depending on which radio bearer it is carrying data.

Figure 7:
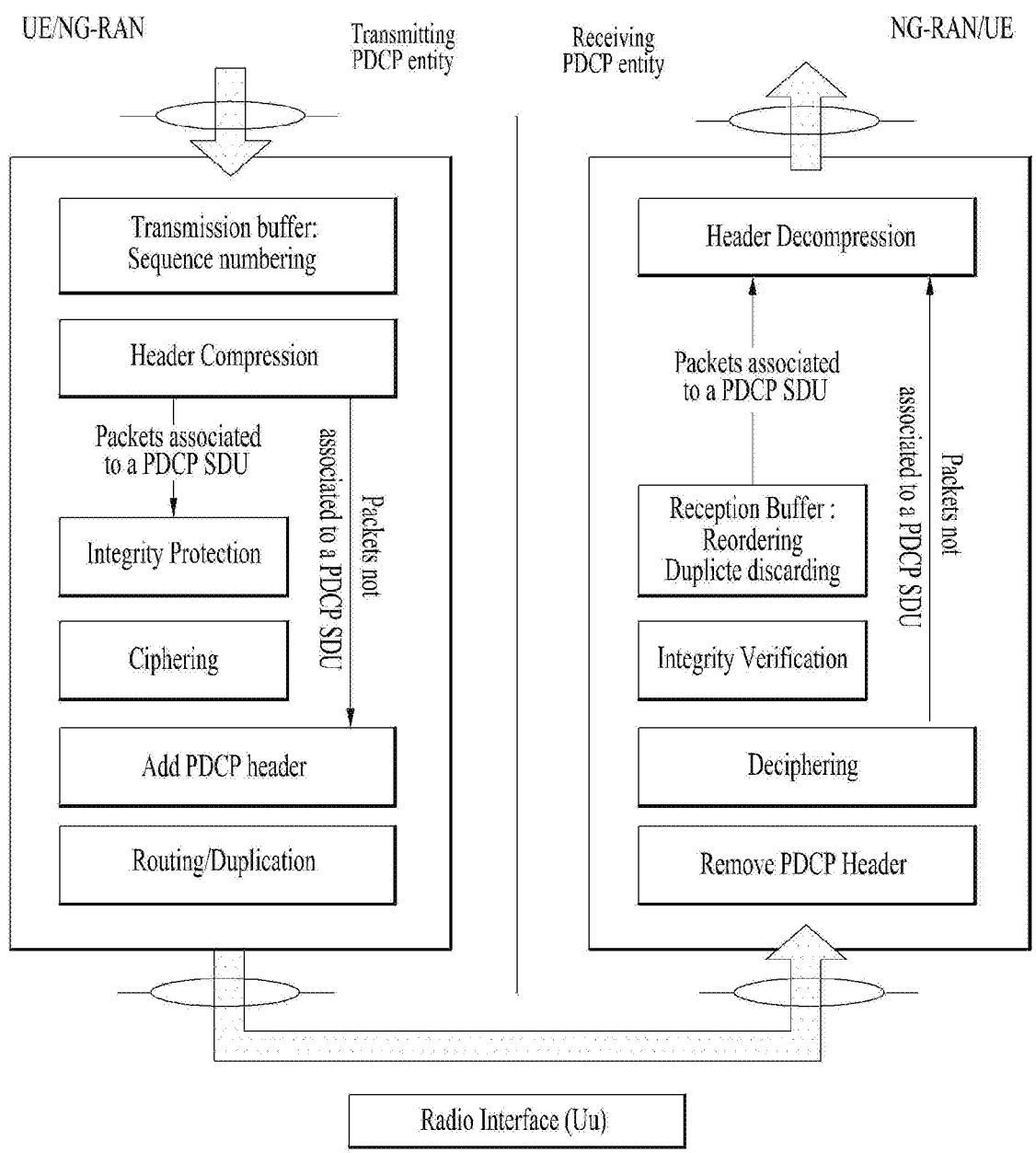
FIG. 7 represents the functional view of the PDCP entity for the PDCP sublayer.

FIG. 7 represents the functional view of the PDCP entity for the PDCP sublayer. For split bearers, routing is performed in the transmitting PDCP entity.

As mentioned above, the header compression protocol is performed based on the ROHC framework. There are multiple header compression algorithms, called profiles, defined for the ROHC framework. Each profile is specific to the particular network layer, transport layer or upper layer protocol combination e.g., TCP/IP and RTP/UDP/IP.

The PDCP entities associated with DRBs (data radio bearers) can be configured by upper layers to use header compression. Each PDCP entity carrying user plane data may be configured to use header compression. Currently, only the robust header compression protocol (ROHC) is supported. Every PDCP entity uses at most one ROHC compressor instance and at most one ROHC decompressor instance.

If header compression is configured, the header compression protocol generates two types of output packets. Firstly, compressed packets, each associated with one PDCP SDU, are generated. Further, standalone packets not associated with a PDCP SDU (i.e., interspersed ROHC feedback) are also generated.

A compressed packet is associated with the same PDCP SN and COUNT value as the related PDCP SDU. The header compression is not applicable to the SDAP header and the SDAP Control PDU if included in the PDCP SDU. Interspersed ROHC feedback are not associated with a PDCP SDU. They are not associated with a PDCP SN and are not ciphered. If header compression is configured by upper layers for PDCP entities associated with user plane data, the PDCP Data PDUs are decompressed by the header compression protocol after performing deciphering. The header decompression is not applicable to the SDAP header and the SDAP Control PDU if included in the PDCP Data PDU.

In the prior art, whether to use ROHC for a radio bearer (RB) is configured by RRC signaling. Once the ROHC is configured, the PDCP entity applies header compression and decompression for all the packets transmitted and received. If the ROHC is not configured, the PDCP entity does not apply header compression and decompression for all the packets transmitted and received. The Ethernet frame, which is typically used in a small closed area (e.g., factory) may or may not contain IP header, depending on the application. For the Ethernet traffic without IP header, a new Header Compression algorithm is currently under study to compress the Ethernet header using Ethernet Header Compression (EHC) algorithm.

The problem is that one PDCP entity may need to apply ROHC or EHC on PDCP SDU basis. This is because one application traffic is mapped to one QoS flow, and multiple QoS flows can be mapped to one DRB. If the PDCP entity is used for a DRB that serves multiple QoS flows, and if one QoS flow is for Ethernet traffic and another QoS flow is for IP traffic, the PDCP entity should serve PDCP SDU with Ethernet and PDCP SDU with IP simultaneously.

If both ROHC and EHC are configured, the transmitting PDCP entity applies either ROHC or EHC depending on whether the PDCP SDU contains IP or Ethernet. However, there is no indication in the constructed PDCP PDU indicating which header compression algorithm is applied. Without the indication of applied header compression algorithm, the receiving PDCP entity does not know which header compression algorithm is applied for the received PDCP PDU, and cannot apply correct header decompression algorithm. It may lead to header decompression failure, and the packet may be lost.

Therefore, for supporting packet transmission with different header compression algorithms, the present disclosure suggests that the transmitting PDCP entity should include a header compression indicator in the constructed PDCP PDU to indicate which header compression algorithm is applied for the PDCP SDU included in the PDCP PDU.

Figure 8:
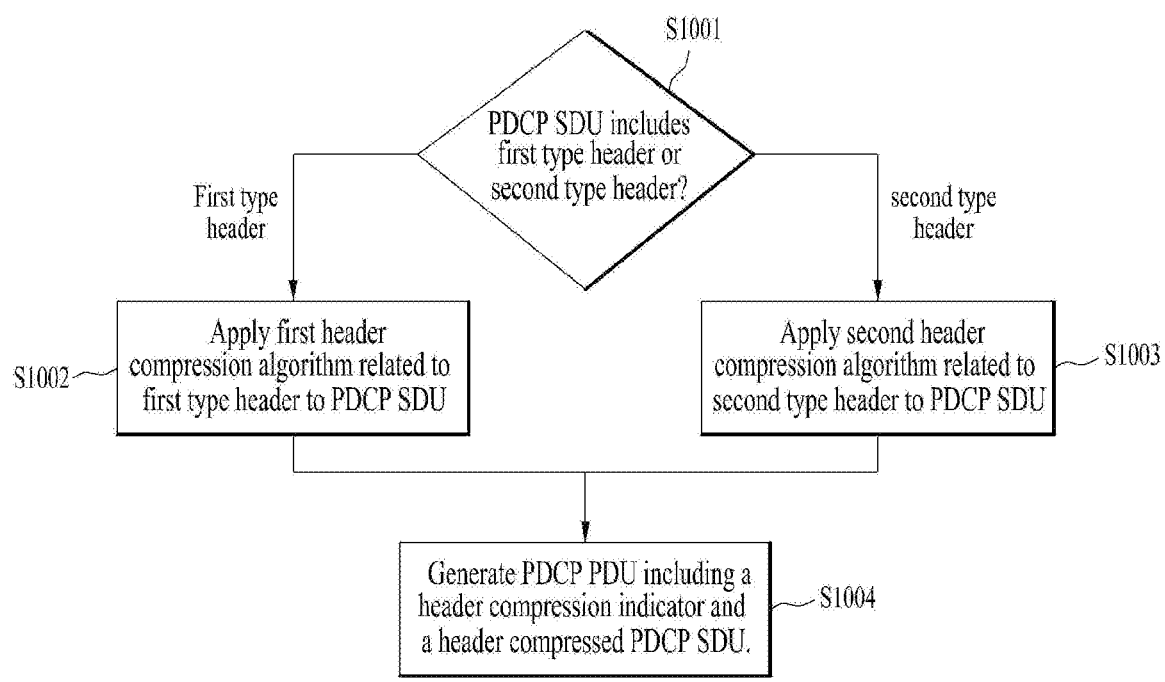
FIG. 8 illustrates an example of a procedure at a transmitting side according to the present disclosure.

FIG. 8 illustrates an example of a procedure at a transmitting side according to the present disclosure. Especially, in FIG. 8, IP header and Ethernet header are mainly used as an example of the first type header and the second type header respectively, and ROHC and EHC are mainly used as an example of the first header compression algorithm and the second header compression algorithm, respectively. However, the present disclosure may be also applied for other types of headers and other types of header compression algorism.

Referring to FIG. 8, upon reception of a PDCP SDU from an upper layer, the transmitting PDCP entity checks whether the PDCP SDU includes first type header (e.g. IP header) or second type header (e.g. Ethernet header) (S1001). The upper layer could be an SDAP layer, IP layer, Ethernet layer, or other layer.

If the PDCP SDU includes the first type header (e.g. IP header), the transmitting PDCP entity applies first header compression algorithm related to the first type header (e.g. ROHC related to IP header) for the PDCP SDU (S1002). If the PDCP SDU includes the second type header (e.g. Ethernet header), the transmitting PDCP entity applies the second type header related to the second type header (e.g., EHC) for the PDCP SDU (S1003). If the PDCP SDU includes both the first type (e.g., IP) and the second type (e.g., Ethernet) headers, the transmitting PDCP entity applies either the first header compression algorithm (e.g., ROHC) or EHC based on the predetermined rule.

Once the transmitting PDCP entity applies ROHC or EHC for the PDCP SDU, the transmitting PDCP entity constructs a PDCP PDU including a header compression indicator and a header compressed PDCP SDU (S1004), after performing relevant procedures, e.g. ciphering, integrity protection, state variable updates, etc.

The header compression indicator could be a 1-bit indicator indicating which header compression algorithm between ROHC and EHC is applied for the PDCP SDU included in the same PDCP PDU. If more than two header compression algorithms are used, the header compression indicator could be more than 1-bit.

The header compression indicator could be included in the PDCP PDU header. One of the existing reserved bits in a PDCP PDU format could be used for this purpose.

Figure 9:
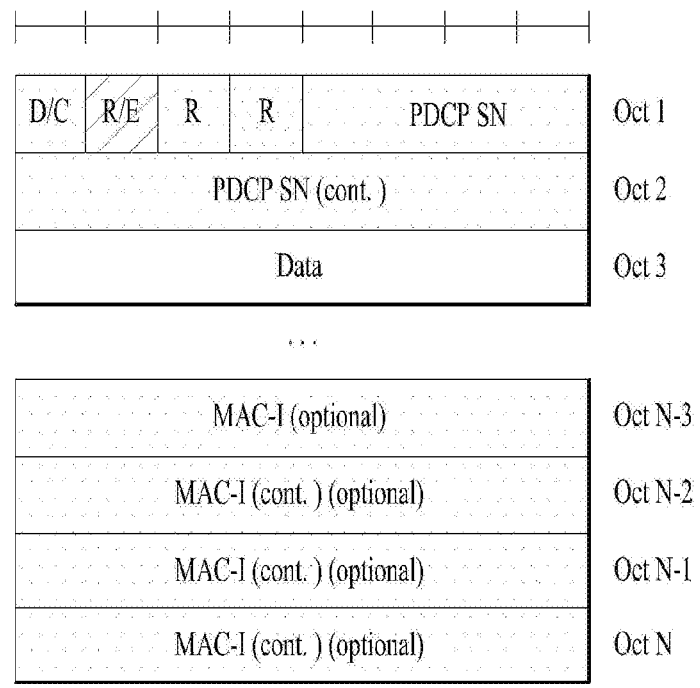
FIG. 9 and FIG. 10 show examples of PDCP PDU with header compression indicator according to the present disclosure.
Figure 10:
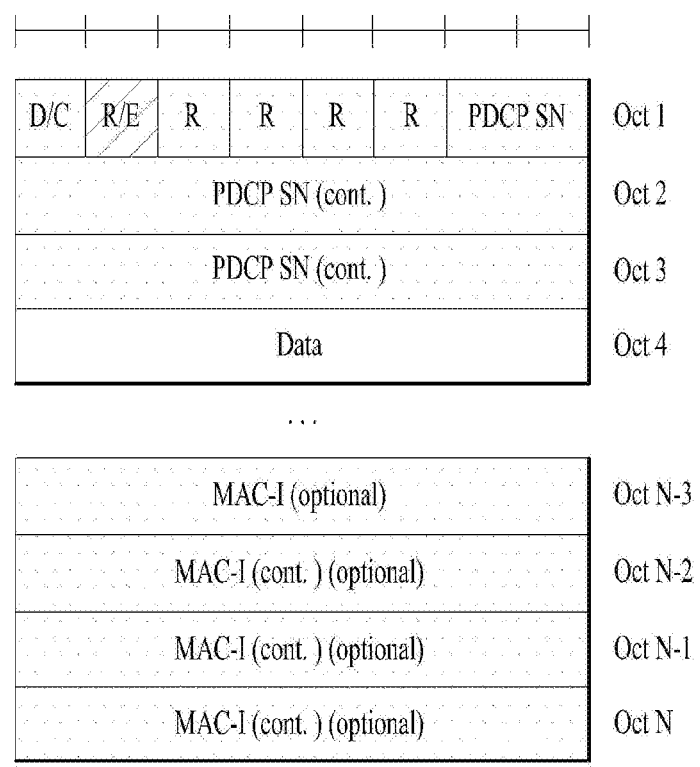

FIG. 9 and FIG. 10 show examples of PDCP PDU with header compression indicator according to the present disclosure. Especially, in FIG. 9, the header compression indicator is for the 12-bits PDCP SN. Further, in FIG. 10, the header compression indicator is for 18-bits PDCP SN. In in FIG. 9 and FIG. 10, the R/E bit means whether the ROHC or EHC is applied for the PDCP SDU (i.e., the Data part).

Figure 11:
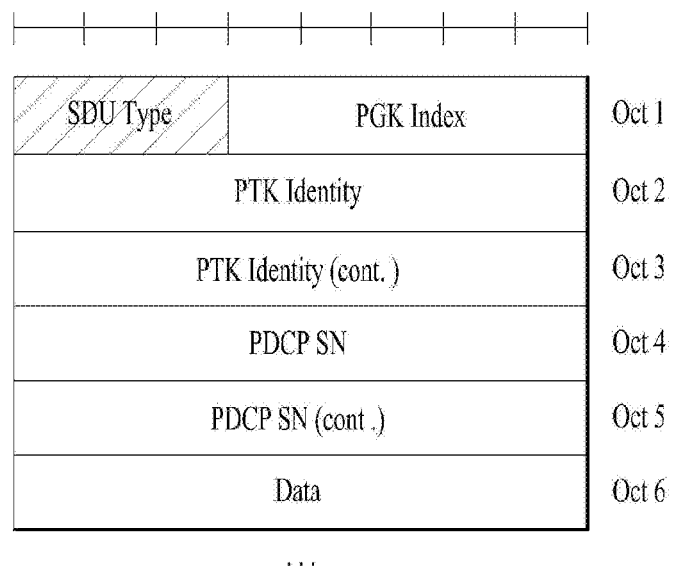
FIG. 11 shows another example of header compression indicator according to the present disclosure.

FIG. 11 shows another example of header compression indicator according to the present disclosure.

In FIG. 11, for the sidelink communication, the header compression indicator could use other fields in the header (e.g., SDU Type field). In this case, one of the values for SDU Type field is allocated to indicate ROHC is applied, and another value of the SDU Type field is allocated to indicate EHC is applied.

In the present disclosure, the sidelink communication is used to denote access stratum (AS) functionality enabling ProSe Direct Communication as defined in 3GPP TS 23.303, between two or more nearby UEs, using E-UTRA technology but not traversing any network node. Further, the sidelink is used to denote UE to UE interface for sidelink communication, V2X sidelink communication and sidelink discovery.

The V2X sidelink communication is AS functionality enabling V2X Communication, between nearby UEs, using E-UTRA technology but not traversing any network node, and the sidelink discovery means AS functionality enabling ProSe Direct Discovery, using E-UTRA technology but not traversing any network node. The sidelink may be correspond to the PC5 interface. Sidelink transmissions are defined for sidelink discovery, sidelink communication and V2X sidelink communication between UEs.

The header compression indicator is not ciphered as it is included in the PDCP PDU header. The header compression indicator is integrity protected as it is included in the PDCP PDU header.

After constructing the PDCP PDU including the header compression indicator, the transmitting PDCP entity submits the constructed PDCP PDU to the lower layer (e.g. RLC entity (or entities)) or LWAAP (LTE-WLAN Aggregation Adaptation Protocol) entity (or entities), for the transmission to the peer receiving PDCP entity via air interface.

Figure 12:
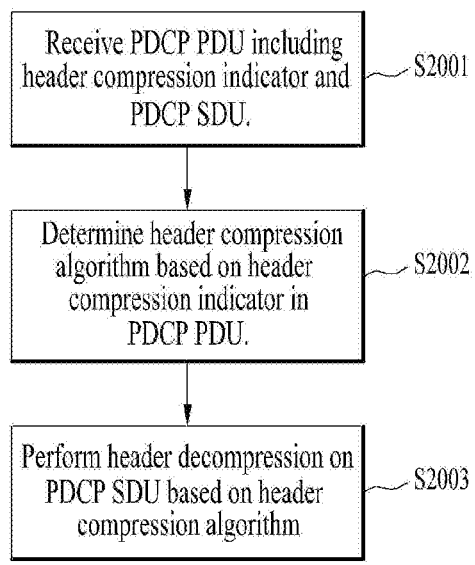
FIG. 12 illustrates an example of a procedure at a reception side according to the present disclosure.

FIG. 12 illustrates an example of a procedure at a reception side according to the present disclosure.

Firstly, a communication device (e.g., UE or BS) may receive radio signals containing a PDCP PDUs. Upon reception of a PDCP PDU from a lower layer (e.g. RLC entity or LWAAP entity) (S2001), the receiving PDCP entity checks the header compression indicator included in the PDCP PDU to figure out which header compression algorithm is applied for the PDCP SDU included in the received PDCP PDU (S2002).

If the header compression indicator indicates ROHC is applied for the PDCP SDU (S2002), the receiving PDCP entity performs header decompression of the PDCP SDU using ROHC (S2003), after performing necessary procedures, e.g. deciphering, integrity verification, reordering, state variable updates, etc.

If the header compression indicator indicates EHC is applied for the PDCP SDU, the receiving PDCP entity performs header decompression of the PDCP SDU using EHC, after performing necessary procedures, e.g. deciphering, integrity verification, reordering, state variable updates, etc. While, if the header compression indicator indicates a specific header compression algorithm is applied for the PDCP SDU (S2002), the receiving PDCP entity performs header decompression of the PDCP SDU using the specific header compression algorithm (S2003), after performing necessary procedures, e.g. deciphering, integrity verification, reordering, state variable updates, etc.

After performing header decompression of the PDCP SDU using the indicated header compression algorithm, the receiving PDCP entity delivers the header decompressed PDCP SDU to upper layer, e.g. SDAP layer, IP layer, Ethernet layer, or other layer.

The transmitting PDCP entity is located in either UE or BS, and the receiving PDCP entity is located in either BS or UE. The invention can also be used for sidelink communication where the transmitting PDCP entity is located in one UE and the receiving PDCP entity is located in another UE.

Using the present disclosure, the receiving PDCP entity can decompress the received PDCP PDU using the correct header compression algorithm, even in case when multiple header compression algorithms are configured. The present disclosure is beneficial in that it can reduce header overhead even in case when multiple traffic flows with different types of header are served by a radio bearer.

In order to transmit data unit(s) of the present disclosure on UL-SCH, a UE shall have uplink resources available to the UE. In order to receive data unit(s) of the present disclosure on DL-SCH, a UE shall have downlink resources available to the UE. The resource allocation includes time domain resource allocation and frequency domain resource allocation. In the present disclosure, uplink resource allocation is also referred to as uplink grant, and downlink resource allocation is also referred to as downlink assignment. An uplink grant is either received by the UE dynamically on PDCCH, in a Random Access Response, or configured to the UE semi-persistently by RRC. Downlink assignment is either received by the UE dynamically on the PDCCH, or configured to the UE semi-persistently by RRC signaling from the BS.

In UL, the BS can dynamically allocate resources to UEs via the Cell Radio Network Temporary Identifier (C-RNTI) on PDCCH(s). A UE always monitors the PDCCH(s) in order to find possible grants for uplink transmission when its downlink reception is enabled (activity governed by discontinuous reception (DRX) when configured). In addition, with Configured Grants, the BS can allocate uplink resources for the initial HARQ transmissions to UEs. Two types of configured uplink grants are defined: Type 1 and Type 2. With Type 1, RRC directly provides the configured uplink grant (including the periodicity). With Type 2, RRC defines the periodicity of the configured uplink grant while PDCCH addressed to Configured Scheduling RNTI (CS-RNTI) can either signal and activate the configured uplink grant, or deactivate it; i.e. a PDCCH addressed to CS-RNTI indicates that the uplink grant can be implicitly reused according to the periodicity defined by RRC, until deactivated.

In DL, the BS can dynamically allocate resources to UEs via the C-RNTI on PDCCH(s). A UE always monitors the PDCCH(s) in order to find possible assignments when its downlink reception is enabled (activity governed by DRX when configured). In addition, with Semi-Persistent Scheduling (SPS), the BS can allocate downlink resources for the initial HARQ transmissions to UEs: RRC defines the periodicity of the configured downlink assignments while PDCCH addressed to CS-RNTI can either signal and activate the configured downlink assignment, or deactivate it. In other words, a PDCCH addressed to CS-RNTI indicates that the downlink assignment can be implicitly reused according to the periodicity defined by RRC, until deactivated.

<Resource Allocation by PDCCH (i.e. Resource Allocation by DCI)>

PDCCH can be used to schedule DL transmissions on PDSCH and UL transmissions on PUSCH, where the downlink control information (DCI) on PDCCH includes: downlink assignments containing at least modulation and coding format (e.g., modulation and coding scheme (MCS) index IMCS), resource allocation, and hybrid-ARQ information related to DL-SCH; or uplink scheduling grants containing at least modulation and coding format, resource allocation, and hybrid-ARQ information related to UL-SCH. The size and usage of the DCI carried by one PDCCH are varied depending on DCI formats. For example, in the 3GPP NR system, DCI format 0_0 or DCI format 0_1 is used for scheduling of PUSCH in one cell, and DCI format 1_0 or DCI format 1_1 is used for scheduling of PDSCH in one cell.

Figure 13:
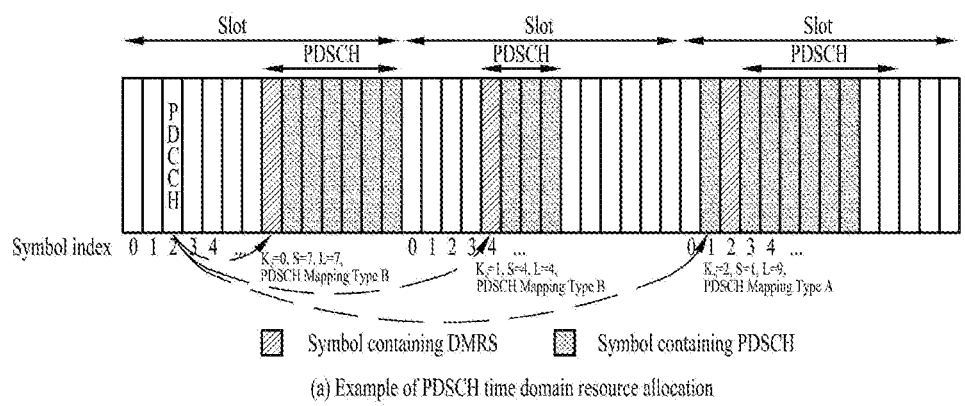
FIG. 13 illustrates an example of PDSCH time domain resource allocation by PDCCH, and an example of PUSCH time resource allocation by PDCCH.
Figure 13:
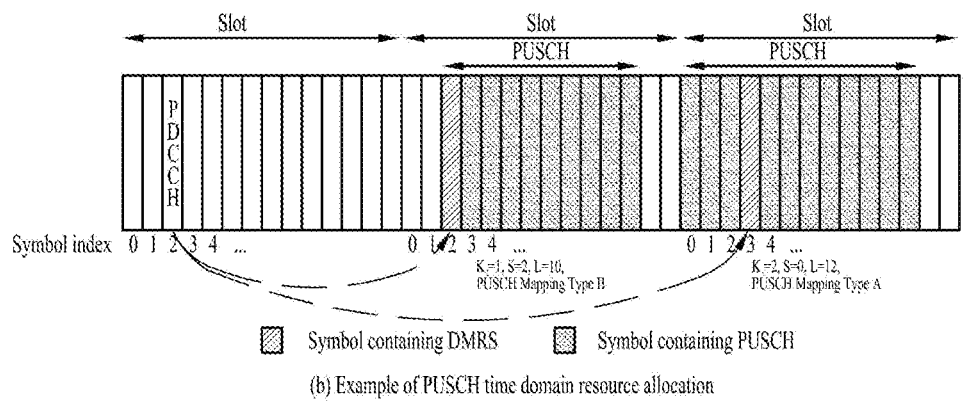

FIG. 13 illustrates an example of PDSCH time domain resource allocation by PDCCH, and an example of PUSCH time resource allocation by PDCCH.

Downlink control information (DCI) carried by a PDCCH for scheduling PDSCH or PUSCH includes a value m for a row index m+1 to an allocation table for PDSCH or PUSCH. Either a predefined default PDSCH time domain allocation A, B or C is applied as the allocation table for PDSCH, or RRC configured pdsch-TimeDomainAllocationList is applied as the allocation table for PDSCH. Either a predefined default PUSCH time domain allocation A is applied as the allocation table for PUSCH, or the RRC configured pusch-TimeDomainAllocationList is applied as the allocation table for PUSCH. Which PDSCH time domain resource allocation configuration to apply and which PUSCH time domain resource allocation table to apply are determined according to a fixed/predefined rule (e.g. Table 5.1.2.1.1-1 in 3GPP TS 38.214 v15.3.0, Table 6.1.2.1.1-1 in 3GPP TS 38.214 v15.3.0).

Each indexed row in PDSCH time domain allocation configurations defines the slot offset $K_0$, the start and length indicator SLIV, or directly the start symbol S and the allocation length L, and the PDSCH mapping type to be assumed in the PDSCH reception. Each indexed row in PUSCH time domain allocation configurations defines the slot offset $K_2$, the start and length indicator SLIV, or directly the start symbol S and the allocation length L, and the PUSCH mapping type to be assumed in the PUSCH reception. $K_0$ for PDSCH, or $K_2$ for PUSCH is the timing difference between a slot with a PDCCH and a slot with PDSCH or PUSCH corresponding to the PDCCH. SLIV is a joint indication of starting symbol S relative to the start of the slot with PDSCH or PUSCH, and the number L of consecutive symbols counting from the symbol S. For PDSCH/PUSCH mapping type, there are two mapping types: one is Mapping Type A where demodulation reference signal (DMRS) is positioned in $3^{rd}$ or $4^{th}$ symbol of a slot depending on the RRC signaling, and other one is Mapping Type B where DMRS is positioned in the first allocated symbol.

The scheduling DCI includes the Frequency domain resource assignment field which provides assignment information on resource blocks used for PDSCH or PUSCH. For example, the Frequency domain resource assignment field may provide a UE with information on a cell for PDSCH or PUSCH transmission, information on a bandwidth part for PDSCH or PUSCH transmission, information on resource blocks for PDSCH or PUSCH transmission.

<Resource Allocation by RRC>

As mentioned above, in uplink, there are two types of transmission without dynamic grant: configured grant Type 1 where an uplink grant is provided by RRC, and stored as configured grant; and configured grant Type 2 where an uplink grant is provided by PDCCH, and stored or cleared as configured uplink grant based on L1 signaling indicating configured uplink grant activation or deactivation. Type 1 and Type 2 are configured by RRC per serving cell and per BWP. Multiple configurations can be active simultaneously only on different serving cells. For Type 2, activation and deactivation are independent among the serving cells. For the same serving cell, the MAC entity is configured with either Type 1 or Type 2.

A UE is provided with at least the following parameters via RRC signaling from a BS when the configured grant type 1 is configured:
  cs-RNTI which is CS-RNTI for retransmission;
  periodicity which provides periodicity of the configured grant Type 1;
  timeDomainOffset which represents offset of a resource with respect to SFN=0 in time domain;
  timeDomainAllocation value m which provides a row index m+1 pointing to an allocation table, indicating a combination of a start symbol S and length L and PUSCH mapping type;
  frequencyDomainAllocation which provides frequency domain resource allocation; and
  mcsAndTBS which provides IMCS representing the modulation order, target code rate and transport block size. Upon configuration of a configured grant Type 1 for a serving cell by RRC, the UE stores the uplink grant provided by RRC as a configured uplink grant for the indicated serving cell, and initialise or re-initialise the configured uplink grant to start in the symbol according to timeDomainOffset and S (derived from SLIV), and to reoccur with periodicity. After an uplink grant is configured for a configured grant Type 1, the UE considers that the uplink grant recurs associated with each symbol for which:
  [(SFN*numberOfSlotsPerFrame (numberOfSymbolsPerSlot)+(slot number in the frame×numberOfSymbolsPerSlot)+symbol number in the slot]= (timeDomainOffset*numberOfSymbolsPerSlot+S+ N*periodicity) modulo (1024*numberOfSlotsPerFrame*numberOfSymbols PerSlot), for all N>=0.

A UE is provided with at least the following parameters via RRC signaling from a BS when the configured gran Type 2 is configured:
  cs-RNTI which is CS-RNTI for activation, deactivation, and retransmission; and
  periodicity which provides periodicity of the configured grant Type 2. The actual uplink grant is provided to the UE by the PDCCH (addressed to CS-RNTI). After an uplink grant is configured for a configured grant Type 2, the UE considers that the uplink grant recurs associated with each symbol for which:
  [(SFN*numberOfSlotsPerFrame*numberOfSymbols PerSlot)+(slot number in the frame*numberOfSymbolsPerSlot)+symbol number in the slot]= [(SFN$_{start\ time}$*numberOfSlotsPerFrame*numberOfSymbolsPer Slot+slot$_{start\ time}$*numberOfSymbolsPerSlot+ symbol$_{start\ time}$)+N*periodicity] modulo (1024× numberOfSlotsPerFrame*numberOfSymbolsPerSlot), for all N>=0, where SFN$_{start\ time}$, slot$_{start\ time}$, and symbol$_{start\ time}$ are the SFN, slot, and symbol, respectively, of the first transmission opportunity of PUSCH where the configured uplink grant was (re-)initialised. numberOfSlotsPerFrame and numberOfSymbolsPerSlot refer to the number of consecutive slots per frame and the number of consecutive OFDM symbols per slot, respectively (see Table 1 and Table 1).

For configured uplink grants, the HARQ Process ID associated with the first symbol of a UL transmission is derived from the following equation:

HARQ Process ID=[floor(CURRENT_symbol/periodicity)] modulo nrofHARQ-Processes where CURRENT_symbol=(SFN×numberOfSlotsPerFrame×numberOfSymbolsPerSlot+slot number in the frame×numberOfSymbolsPerSlot+symbol number in the slot), and numberOfSlotsPerFrame and numberOfSymbolsPerSlot refer to the number of consecutive slots per frame and the number of consecutive symbols per slot, respectively as specified in TS 38.211. CURRENT_symbol refers to the symbol index of the first transmission occasion of a repetition bundle that takes place. A HARQ process is configured for a configured uplink grant if the configured uplink grant is activated and the associated HARQ process ID is less than nrofHARQ-Processes.

For downlink, a UE may be configured with semi-persistent scheduling (SPS) per serving cell and per BWP by RRC signaling from a BS. Multiple configurations can be active simultaneously only on different serving cells. Activation and deactivation of the DL SPS are independent among the serving cells. For DL SPS, a DL assignment is provided to the UE by PDCCH, and stored or cleared based on L1 signaling indicating SPS activation or deactivation. A UE is provided with the following parameters via RRC signaling from a BS when SPS is configured:

cs-RNTI which is CS-RNTI for activation, deactivation, and retransmission;

nrofHARQ-Processes: which provides the number of configured HARQ processes for SPS;

periodicity which provides periodicity of configured downlink assignment for SPS.

When SPS is released by upper layers, all the corresponding configurations shall be released.

After a downlink assignment is configured for SPS, the UE considers sequentially that the $N^{th}$ downlink assignment occurs in the slot for which: (numberOfSlotsPerFrame*SFN+slot number in the frame)= [(numberOfSlotsPerFrame*$SFN_{start\ time}$+$slot_{start\ time}$)+ N*periodicity*numberOfSlotsPerFrame/10] modulo (1024*numberOfSlotsPerFrame), where $SFN_{start\ time}$ and $slot_{start\ time}$ are the SFN and slot, respectively, of the first transmission of PDSCH where the configured downlink assignment was (re-)initialised.

For configured downlink assignments, the HARQ Process ID associated with the slot where the DL transmission starts is derived from the following equation:

HARQ Process ID=[floor(CURRENT_slot×10/(numberOfSlotsPerFrame×periodicity))] modulo nrofHARQ-Processes where CURRENT_slot=[(SFN×numberOfSlotsPerFrame)+slot number in the frame] and numberOfSlotsPerFrame refers to the number of consecutive slots per frame as specified in TS 38.211.

A UE validates, for scheduling activation or scheduling release, a DL SPS assignment PDCCH or configured UL grant type 2 PDCCH if the cyclic redundancy check (CRC) of a corresponding DCI format is scrambled with CS-RNTI provided by the RRC parameter cs-RNTI and the new data indicator field for the enabled transport block is set to 0. Validation of the DCI format is achieved if all fields for the DCI format are set according to Table 4 or Table 5. Table 4 shows special fields for DL SPS and UL grant Type 2 scheduling activation PDCCH validation, and Table 5 shows special fields for DL SPS and UL grant Type 2 scheduling release PDCCH validation.

TABLE 4

|  | DCI format 0_0/0_1 | DCI format 1_0 | DCI format 1_1 |
|---|---|---|---|
| HARQ process number | set to all '0's | set to all '0's | set to all '0's |
| Redundancy version | set to '00' | set to '00' | For the enabled transport block: set to '00' |

TABLE 5

|  | DCI format 0_0 | DCI format 1_0 |
|---|---|---|
| HARQ process number | set to all '0's | set to all '0's |
| Redundancy version | set to '00' | set to '00' |
| Modulation and coding scheme | set to all '1's | set to all '1's |
| Resource block assignment | set to all '1's | set to all '1's |

Actual DL assignment and actual UL grant, and the corresponding modulation and coding scheme are provided by the resource assignment fields (e.g. time domain resource assignment field which provides Time domain resource assignment value m, frequency domain resource assignment field which provides the frequency resource block allocation, modulation and coding scheme field) in the DCI format carried by the DL SPS and UL grant Type 2 scheduling activation PDCCH. If validation is achieved, the UE considers the information in the DCI format as valid activation or valid release of DL SPS or configured UL grant Type 2.

For UL, the processor(s) 102 of the present disclosure may transmit (or control the transceiver(s) 106 to transmit) the data unit of the present disclosure based on the UL grant available to the UE. The processor(s) 202 of the present disclosure may receive (or control the transceiver(s) 206 to receive) the data unit of the present disclosure based on the UL grant available to the UE.

For DL, the processor(s) 102 of the present disclosure may receive (or control the transceiver(s) 106 to receive) DL data of the present disclosure based on the DL assignment available to the UE. The processor(s) 202 of the present disclosure may transmit (or control the transceiver(s) 206 to transmit) DL data of the present disclosure based on the DL assignment available to the UE.

The data unit(s) of the present disclosure is(are) subject to the physical layer processing at a transmitting side before transmission via radio interface, and the radio signals carrying the data unit(s) of the present disclosure are subject to the physical layer processing at a receiving side. For example, a MAC PDU including the PDCP PDU according to the present disclosure may be subject to the physical layer processing as follows.

Figure 14:
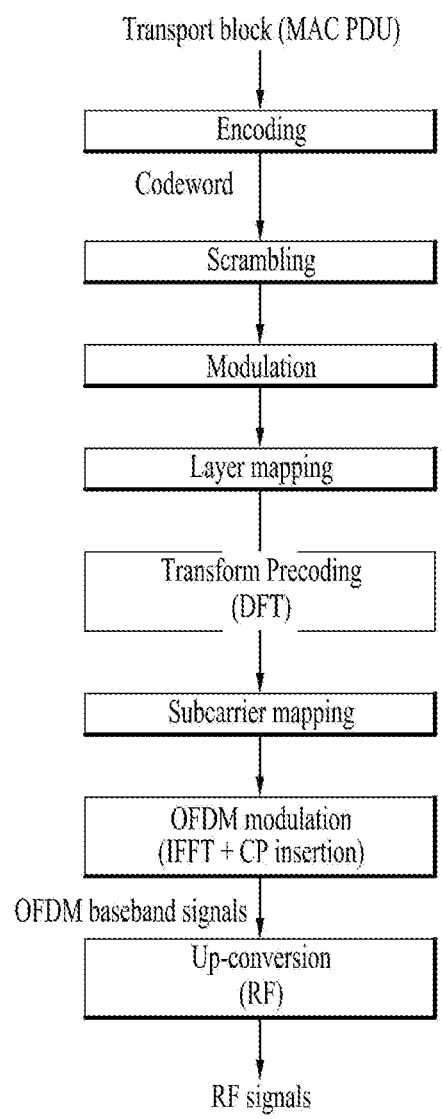
FIG. 14 illustrates an example of physical layer processing at a transmitting side.

FIG. 14 illustrates an example of physical layer processing at a transmitting side.

The following tables show the mapping of the transport channels (TrCHs) and control information to its corresponding physical channels. In particular, Table 6 specifies the mapping of the uplink transport channels to their corresponding physical channels, Table 7 specifies the mapping of the uplink control channel information to its corresponding physical channel, Table 8 specifies the mapping of the downlink transport channels to their corresponding physical channels, and Table 9 specifies the mapping of the downlink control channel information to its corresponding physical channel

TABLE 6

| TrCH | Physical Channel |
|---|---|
| UL-SCH | PUSCH |
| RACH | PRACH |

TABLE 7

| Control information | Physical Channel |
|---|---|
| UCI | PUCCH, PUSCH |

TABLE 8

| TrCH | Physical Channel |
|---|---|
| DL-SCH | PDSCH |
| BCH | PBCH |
| PCH | PDSCH |

TABLE 9

| Control information | Physical Channel |
|---|---|
| DCI | PDCCH |

<Encoding>

Data and control streams from/to MAC layer are encoded to offer transport and control services over the radio transmission link in the PHY layer. For example, a transport block from MAC layer is encoded into a codeword at a transmitting side. Channel coding scheme is a combination of error detection, error correcting, rate matching, interleaving and transport channel or control information mapping onto/splitting from physical channels.

In the 3GPP NR system, following channel coding schemes are used for the different types of TrCH and the different control information types.

TABLE 10

| TrCH | Coding scheme |
|---|---|
| UL-SCH | LDPC |
| DL-SCH | |
| PCH | |
| BCH | Polar code |

TABLE 11

| Control Information | Coding scheme |
|---|---|
| DCI | Polar code |
| UCI | Block code |
| | Polar code |

For transmission of a DL transport block (i.e. a DL MAC PDU) or a UL transport block (i.e. a UL MAC PDU), a transport block CRC sequence is attached to provide error detection for a receiving side. In the 3GPP NR system, the communication device uses low density parity check (LDPC) codes in encoding/decoding UL-SCH and DL-SCH. The 3GPP NR system supports two LDPC base graphs (i.e. two LDPC base matrixes): LDPC base graph 1 optimized for small transport blocks and LDPC base graph 2 for larger transport blocks. Either LDPC base graph 1 or 2 is selected based on the size of the transport block and coding rate R. The coding rate R is indicated by the modulation coding scheme (MCS) index IMCS. The MCS index is dynamically provided to a UE by PDCCH scheduling PUSCH or PDSCH, provided to a UE by PDCCH activating or (re-) initializing the UL configured grant 2 or DL SPS, or provided to a UE by RRC signaling related to the UL configured grant Type 1. If the CRC attached transport block is larger than the maximum code block size for the selected LDPC base graph, the CRC attached transport block may be segmented into code blocks, and an additional CRC sequence is attached to each code block. The maximum code block sizes for the LDPC base graph 1 and the LDPC base graph 2 are 8448 bits and 3480 bits, respectively. If the CRC attached transport block is not larger than the maximum code block size for the selected LDPC base graph, the CRC attached transport block is encoded with the selected LDPC base graph. Each code block of the transport block is encoded with the selected LDPC base graph. The LDPC coded blocks are then individually rat matched. Code block concatenation is performed to create a codeword for transmission on PDSCH or PUSCH. For PDSCH, up to 2 codewords (i.e. up to 2 transport blocks) can be transmitted simultaneously on the PDSCH. PUSCH can be used for transmission of UL-SCH data and layer 1/2 control information. Although not shown in FIG. 8, the layer 1/2 control information may be multiplexed with the codeword for UL-SCH data.

<Scrambling and Modulation>

The bits of the codeword are scrambled and modulated to generate a block of complex-valued modulation symbols.

<Layer Mapping>

The complex-valued modulation symbols of the codeword are mapped to one or more multiple input multiple output (MIMO) layers. A codeword can be mapped to up to 4 layers. A PDSCH can carry two codewords, and thus a PDSCH can support up to 8-layer transmission. A PUSCH supports a single codeword, and thus a PUSCH can support up to 4-layer transmission.

<Transform Precoding>

The DL transmission waveform is conventional OFDM using a cyclic prefix (CP). For DL, transform precoding (in other words, discrete Fourier transform (DFT)) is not applied.

The UL transmission waveform is conventional OFDM using a CP with a transform precoding function performing DFT spreading that can be disabled or enabled. In the 3GPP NR system, for UL, the transform precoding can be optionally applied if enabled. The transform precoding is to spread UL data in a special way to reduce peak-to-average power ratio (PAPR) of the waveform. The transform precoding is a form of DFT. In other words, the 3GPP NR system supports two options for UL waveform: one is CP-OFDM (same as DL waveform) and the other one is DFT-s-OFDM. Whether a UE has to use CP-OFDM or DFT-s-OFDM is configured by a BS via RRC parameters.

<Subcarrier Mapping>

The layers are mapped to antenna ports. In DL, for the layers to antenna ports mapping, a transparent manner (non-codebook based) mapping is supported and how beamforming or MIMO precoding is performed is transparent to the UE. In UL, for the layers to antenna ports mapping, both the non-codebook based mapping and a codebook based mapping are supported.

For each antenna port (i.e. layer) used for transmission of the physical channel (e.g. PDSCH, PUSCH), the complex-valued modulation symbols are mapped to subcarriers in resource blocks allocated to the physical channel <OFDM Modulation>

The communication device at the transmitting side generates a time-continuous OFDM baseband signal on antenna port p and subcarrier spacing configuration u for OFDM symbol l in a TTI for a physical channel by adding a cyclic prefix (CP) and performing IFFT. For example, for each OFDM symbol, the communication device at the transmitting side may perform inverse fast Fourier transform (IFFT) on the complex-valued modulation symbols mapped to resource blocks in the corresponding OFDM symbol and add a CP to the IFFT-ed signal to generate the OFDM baseband signal.

<Up-Conversion>

The communication device at the transmitting side up-convers the OFDM baseband signal for antenna port p, subcarrier spacing configuration u and OFDM symbol l to a carrier frequency $f_0$ of a cell to which the physical channel is assigned.

The processors 102 and 202 in FIG. 2 may be configured to perform encoding, schrambling, modulation, layer mapping, transform precoding (for UL), subcarrier mapping, and OFDM modulation. The processors 102 and 202 may control the transceivers 106 and 206 connected to the processors 102 and 202 to up-convert the OFDM baseband signal onto the carrier frequency to generate radio frequency (RF) signals. The radio frequency signals are transmitted through antennas 108 and 208 to an external device.

Figure 15:
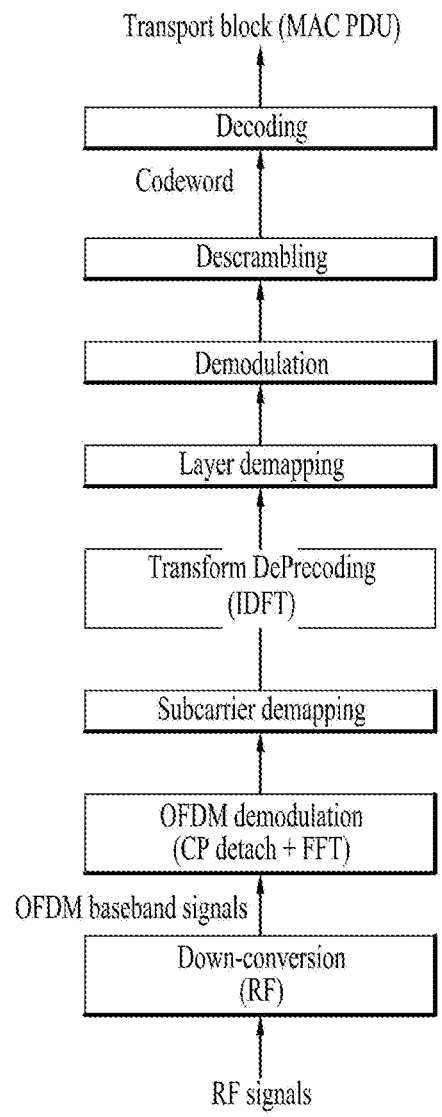
FIG. 15 illustrates an example of physical layer processing at a receiving side.

FIG. 15 illustrates an example of physical layer processing at a receiving side.

The physical layer processing at the receiving side is basically the inverse processing of the physical layer processing at the transmitting side.

<Frequency Down-Conversion>

The communication device at a receiving side receives RF signals at a carrier frequency through antennas. The transceivers 106 and 206 receiving the RF signals at the carrier frequency down-converts the carrier frequency of the RF signals into the baseband in order to obtain OFDM baseband signals.

<OFDM Demodulation>

The communication device at the receiving side obtains complex-valued modulation symbols via CP detachment and FFT. For example, for each OFDM symbol, the communication device at the receiving side removes a CP from the OFDM baseband signals and performs FFT on the CP-removed OFDM baseband signals to obtain complex-valued modulation symbols for antenna port p, subcarrier spacing u and OFDM symbol 1.

<Subcarrier Demapping>

The subcarrier demapping is performed on the complex-valued modulation symbols to obtain complex-valued modulation symbols of a corresponding physical channel. For example, the processor(s) 102 may obtain complex-valued modulation symbols mapped to subcarriers belong to PDSCH from among complex-valued modulation symbols received in a bandwidth part. For another example, the processor(s) 202 may obtain complex-valued modulation symbols mapped to subcarriers belong to PUSCH from among complex-valued modulation symbols received in a bandwidth part.

<Transform De-Precoding>

Transform de-precoding (e.g. IDFT) is performed on the complex-valued modulation symbols of the uplink physical channel if the transform precoding has been enabled for the uplink physical channel. For the downlink physical channel and for the uplink physical channel for which the transform precoding has been disabled, the transform de-precoding is not performed.

<Layer Demapping>

The complex-valued modulation symbols are de-mapped into one or two codewords.

<Demodulation and Descrambling>

The complex-valued modulation symbols of a codeword are demodulated and descrambled into bits of the codeword.

<Decoding>

The codeword is decoded into a transport block. For UL-SCH and DL-SCH, either LDPC base graph 1 or 2 is selected based on the size of the transport block and coding rate R. The codeword may include one or multiple coded blocks. Each coded block is decoded with the selected LDPC base graph into a CRC-attached code block or CRC-attached transport block. If code block segmentation was performed on a CRC-attached transport block at the transmitting side, a CRC sequence is removed from each of CRC-attached code blocks, whereby code blocks are obtained. The code blocks are concatenated into a CRC-attached transport block. The transport block CRC sequence is removed from the CRC-attached transport block, whereby the transport block is obtained. The transport block is delivered to the MAC layer.

In the above described physical layer processing at the transmitting and receiving sides, the time and frequency domain resources (e.g. OFDM symbol, subcarriers, carrier frequency) related to subcarrier mapping, OFDM modulation and frequency up/down conversion can be determined based on the resource allocation (e.g., UL grant, DL assignment).

For uplink data transmission, the processor(s) 102 of the present disclosure may apply (or control the transceiver(s) 106 to apply) the above described physical layer processing of the transmitting side to the data unit of the present disclosure to transmit the data unit wirelessly. For downlink data reception, the processor(s) 102 of the present disclosure may apply (or control the transceiver(s) 106 to apply) the above described physical layer processing of the receiving side to received radio signals to obtain the data unit of the present disclosure.

For downlink data transmission, the processor(s) 202 of the present disclosure may apply (or control the transceiver(s) 206 to apply) the above described physical layer processing of the transmitting side to the data unit of the present disclosure to transmit the data unit wirelessly. For uplink data reception, the processor(s) 202 of the present disclosure may apply (or control the transceiver(s) 206 to apply) the above described physical layer processing of the receiving side to received radio signals to obtain the data unit of the present disclosure.

Figure 16:
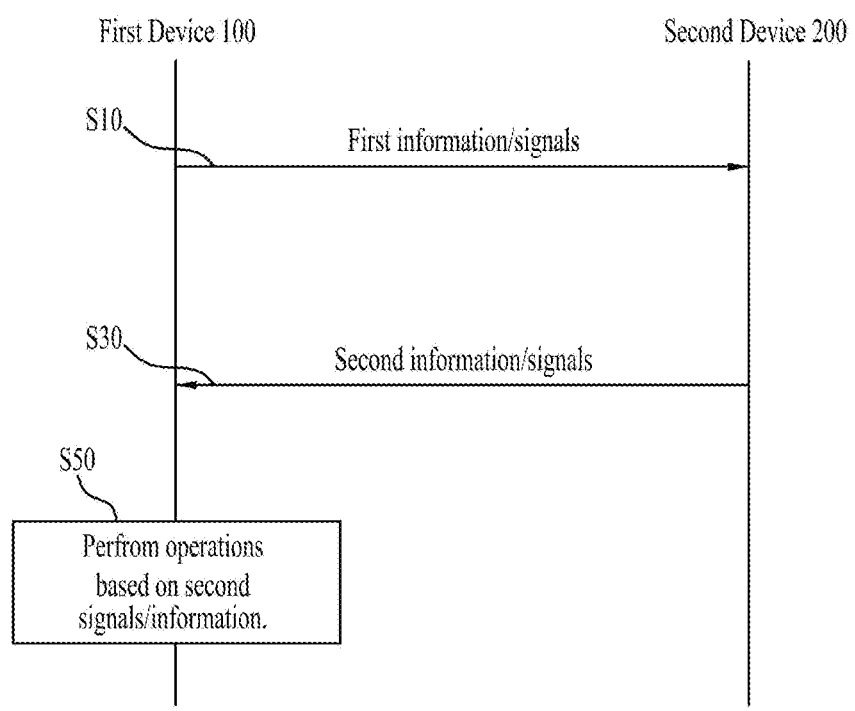
FIG. 16 illustrates operations of the wireless devices based on the implementations of the present disclosure.

FIG. 16 illustrates operations of the wireless devices based on the implementations of the present disclosure.

The first wireless device 100 of FIG. 2 may generate first information/signals according to the functions, procedures, and/or methods described in the present disclosure, and then transmit radio signals including the first information/signals wirelessly to the second wireless device 200 of FIG. 2 (S10). The first information/signals may include the data unit(s) (e.g. PDU, SDU, RRC message) of the present disclosure. The first wireless device 100 may receive radio signals including second information/signals from the second wireless device 200 (S30), and then perform operations based on or according to the second information/signals (S50). The second information/signals may be transmitted by the second wireless device 200 to the first wireless device 100 in response to the first information/signals. The second information/signals may include the data unit(s) (e.g. PDU, SDU, RRC message) of the present disclosure. The first information/signals may include contents request information, and the second information/signals may include contents specific to the usage of the first wireless device 100. Some examples of operations specific to the usages of the wireless devices 100 and 200 will be described below.

In some scenarios, the first wireless device 100 may be a hand-held device 100d of FIG. 1, which performs the functions, procedures, and/or methods described in the present disclosure. The hand-held device 100d may acquire information/signals (e.g., touch, text, voice, images, or video) input by a user, and convert the acquired information/ signals into the first information/signals. The hand-held devices 100d may transmit the first information/signals to the second wireless device 200 (S10). The second wireless device 200 may be any one of the wireless devices 100a to 100f in FIG. 1 or a BS. The hand-held device 100d may receive the second information/signals from the second wireless device 200 (S30), and perform operations based on the second information/signals (S50). For example, the hand-held device 100d may output the contents of the second information/signals to the user (e.g. in the form of text, voice, images, video, or haptic) through the I/O unit of the hand-held device 100d.

In some scenarios, the first wireless device 100 may be a vehicle or an autonomous driving vehicle 100b, which performs the functions, procedures, and/or methods described in the present disclosure. The vehicle 100b may transmit (S10) and receive (S30) signals (e.g. data and control signals) to and from external devices such as other vehicles, BSs (e.g. gNBs and road side units), and servers, through its communication unit (e.g. communication unit 110 of FIG. 1C). The vehicle 100b may include a driving unit, and the driving unit may cause the vehicle 100b to drive on a road. The driving unit of the vehicle 100b may include an engine, a motor, a powertrain, a wheel, a brake, a steering device, etc. The vehicle 100b may include a sensor unit for acquiring a vehicle state, ambient environment information, user information, etc. The vehicle 100b may generate and transmit the first information/signals to the second wireless device 200 (S10). The first information/signals may include vehicle state information, ambient environment information, user information, and etc. The vehicle 100b may receive the second information/signals from the second wireless device 200 (S30). The second information/signals may include vehicle state information, ambient environment information, user information, and etc. The vehicle 100b may drive on a road, stop, or adjust speed, based on the second information/signals (S50). For example, the vehicle 100b may receive map the second information/signals including data, traffic information data, etc. from an external server (S30). The vehicle 100b may generate an autonomous driving path and a driving plan based on the second information/signals, and may move along the autonomous driving path according to the driving plan (e.g., speed/direction control) (S50). For another example, the control unit or processor(s) of the vehicle 100b may generate a virtual object based on the map information, traffic information, and vehicle position information obtained through a GPS sensor of the vehicle 100b and an I/O unit 140 of the vehicle 100b may display the generated virtual object in a window in the vehicle 100b (S50).

In some scenarios, the first wireless device 100 may be an XR device 100c of FIG. 1, which performs the functions, procedures, and/or methods described in the present disclosure. The XR device 100c may transmit (S10) and receive (S30) signals (e.g., media data and control signals) to and from external devices such as other wireless devices, hand-held devices, or media servers, through its communication unit (e.g. communication unit 110 of FIG. 1C). For example, the XR device 100c transmits content request information to another device or media server (S10), and download/stream contents such as films or news from another device or the media server (S30), and generate, output or display an XR object (e.g. an AR/VR/MR object), based on the second information/signals received wirelessly, through an I/O unit of the XR device (S50).

In some scenarios, the first wireless device 100 may be a robot 100a of FIG. 1, which performs the functions, procedures, and/or methods described in the present disclosure. The robot 100a may be categorized into an industrial robot, a medical robot, a household robot, a military robot, etc., according to a used purpose or field. The robot 100a may transmit (S10) and receive (S30) signals (e.g., driving information and control signals) to and from external devices such as other wireless devices, other robots, or control servers, through its communication unit (e.g. communication unit 110 of FIG. 1C). The second information/signals may include driving information and control signals for the robot 100a. The control unit or processor(s) of the robot 100a may control the movement of the robot 100a based on the second information/signals.

In some scenarios, the first wireless device 100 may be an AI device 400 of FIG. 1. The AI device may be implemented by a fixed device or a mobile device, such as a TV, a projector, a smartphone, a PC, a notebook, a digital broadcast terminal, a tablet PC, a wearable device, a Set Top Box (STB), a radio, a washing machine, a refrigerator, a digital signage, a robot, a vehicle, etc. The AI device 400 may transmit (S10) and receive (S30) wired/radio signals (e.g., sensor information, user input, learning models, or control signals) to and from external devices such as other AI devices (e.g., 100a, . . . , 100f, 200, or 400 of FIG. 1) or an AI server (e.g., 400 of FIG. 1) using wired/wireless communication technology. The control unit or processor(s) of the AI device 400 may determine at least one feasible operation of the AI device 400, based on information which is determined or generated using a data analysis algorithm or a machine learning algorithm. The AI device 400 may request that external devices such as other AI devices or AI server provide the AI device 400 with sensor information, user input, learning models, control signals and etc. (S10). The AI device 400 may receive second information/signals (e.g., sensor information, user input, learning models, or control signals) (S30), and the AI device 400 may perform a predicted operation or an operation determined to be preferred among at least one feasible operation based on the second information/signals (S50).

According to the implementations of the present disclosure, a UE performs measurements after transmitting or receiving URLLC traffics during a configured measurement gap, thereby satisfying the requirement for the URLLC service while guaranteeing the UE coverage.

The invention claimed is:

1. A method for receiving a data unit by a receiver in a wireless communication system, the method comprising:
    configuring both a Robust Header Compression (ROHC) decompressor and an Ethernet Header Compression (EHC) decompressor;
    receiving the data unit including a payload, wherein the payload includes both an internet protocol (IP) header and an Ethernet header; and
    determining either the ROHC decompressor or the EHC decompressor based on an indicator included in the data unit, wherein the indicator indicates the ROHC decompressor or the EHC decompressor which is to be applied to the payload,
    decompressing a header of the payload based on the determined decompressor.

2. The method of claim 1,
    wherein the data unit is a Packet Data Convergence Protocol (PDCP) protocol data unit (PDU) including a sequence number (SN), and
    wherein the PDCP PDU further includes a field indicating whether the payload is data information or control information.

3. A method for transmitting a data unit by a transmitter in a wireless communication system, the method comprising:
- configuring both a Robust Header Compression (ROHC) compressor and an Ethernet Header Compression (EHC) compressor;
- determining either the ROHC decompressor or the EHC decompressor;
- compressing a header of a payload including both an internet protocol (IP) header and an Ethernet header, based on the determined compressor; and
- transmitting the data unit including a header compressed payload and an indicator indicating the ROHC compressor or the EHC compressor which is to be applied to the payload.

4. The method of claim 3,
wherein the data unit is a Packet Data Convergence Protocol (PDCP) protocol data unit (PDU) including a sequence number (SN), and
wherein the PDCP PDU further includes a field indicating whether the payload is data information or control information.

5. A wireless node in a wireless communication system, the wireless node comprising:
- a memory; and
- at least one processor functionally coupled to the memory, wherein the at least one processor is configured to:
- configure both a Robust Header Compression (ROHC) compressor and an Ethernet Header Compression (EHC) compressor;
- determine either the ROHC decompressor or the EHC decompressor;
- compress a header of a payload including both an internet protocol (IP) header and an Ethernet header, based on the determined compressor; and
- transmitting the data unit including a header compressed payload and an indicator indicating the ROHC compressor or the EHC compressor which is to be applied to the payload.

6. The wireless node of claim 5,
wherein the data unit is a Packet Data Convergence Protocol (PDCP) protocol data unit (PDU) including a sequence number (SN), and
wherein the PDCP PDU further includes a field indicating whether the payload is data information or control information.

7. The wireless node of claim 5, wherein the at least one processor is further configured to implement at least one advanced driver assistance system (ADAS) function based on signals that control the wireless node.

* * * * *

UNITED STATES PATENT AND TRADEMARK OFFICE
CERTIFICATE OF CORRECTION

Page 1 of 1

PATENT NO. : 11,012,888 B2
APPLICATION NO. : 16/844494
DATED : May 18, 2021
INVENTOR(S) : Seungjune Yi et al.

It is certified that error appears in the above-identified patent and that said Letters Patent is hereby corrected as shown below:

On the Title Page

After item [63], insert:
--Foreign Application Priority Data
Dec. 21, 2018 (KR)..............10-2018-0167578--

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*